United States Patent
Aboagye et al.

(10) Patent No.: US 10,119,192 B2
(45) Date of Patent: *Nov. 6, 2018

(54) EPI BASE RING

(71) Applicant: Applied Materials, Inc., Santa Clara, CA (US)

(72) Inventors: Steve Aboagye, San Jose, CA (US); Paul Brillhart, Pleasanton, CA (US); Surajit Kumar, Sunnyvale, CA (US); Anzhong Chang, San Jose, CA (US); Satheesh Kuppurao, San Jose, CA (US); Mehmet Tugrul Samir, Mountain View, CA (US); David K. Carlson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 190 days.

This patent is subject to a terminal disclaimer.

(21) Appl. No.: 15/136,119

(22) Filed: Apr. 22, 2016

(65) Prior Publication Data
US 2016/0230276 A1    Aug. 11, 2016

Related U.S. Application Data

(63) Continuation of application No. 13/846,355, filed on Mar. 18, 2013, now Pat. No. 9,322,097.
(Continued)

(51) Int. Cl.
*C23C 16/455* (2006.01)
*C23C 16/44* (2006.01)
(Continued)

(52) U.S. Cl.
CPC .... *C23C 16/45502* (2013.01); *C23C 16/4411* (2013.01); *C23C 16/458* (2013.01);
(Continued)

(58) Field of Classification Search
CPC .................................................. C23C 16/4411
See application file for complete search history.

(56) References Cited

U.S. PATENT DOCUMENTS

| | | |
|---|---|---|
| 5,346,578 A | 9/1994 | Benzing et al. |
| 5,578,132 A | 11/1996 | Yamaga et al. |

(Continued)

FOREIGN PATENT DOCUMENTS

| | | |
|---|---|---|
| CN | 1369109 A | 9/2002 |
| CN | 101528973 A | 9/2009 |

(Continued)

OTHER PUBLICATIONS

Search Report for Taiwan Application No. 103107226 dated May 1, 2017.

(Continued)

*Primary Examiner* — Aiden Lee
(74) *Attorney, Agent, or Firm* — Patterson + Sheridan LLP

(57) ABSTRACT

Embodiments described herein relate to a base ring assembly for use in a substrate processing chamber. In one embodiment, the base ring assembly comprises a ring body sized to be received within an inner circumference of the substrate processing chamber, the ring body comprising a loading port for passage of the substrate, a gas inlet, and a gas outlet, wherein the gas inlet and the gas outlet are disposed at opposing ends of the ring body, and an upper ring configured to dispose on a top surface of the ring body, and a lower ring configured to dispose on a bottom surface of the ring body, wherein the upper ring, the lower ring, and the ring body, once assembled, are generally concentric or coaxial.

15 Claims, 13 Drawing Sheets

Related U.S. Application Data

(60) Provisional application No. 61/781,960, filed on Mar. 14, 2013, provisional application No. 61/780,447, filed on Mar. 13, 2013.

(51) Int. Cl.
  *C23C 16/458* (2006.01)
  *C23C 16/48* (2006.01)

(52) U.S. Cl.
  CPC .... *C23C 16/4584* (2013.01); *C23C 16/45504* (2013.01); *C23C 16/45563* (2013.01); *C23C 16/481* (2013.01)

(56) References Cited

U.S. PATENT DOCUMENTS

| | | | |
|---|---|---|---|
| 5,597,439 | A | 1/1997 | Salzman |
| 5,879,459 | A | 3/1999 | Gadgil et al. |
| 6,153,260 | A | 11/2000 | Comita et al. |
| 6,245,149 | B1* | 6/2001 | de Lomenie ........ C23C 16/4405 118/715 |
| 6,344,631 | B1 | 2/2002 | Chacin |
| 6,406,543 | B1* | 6/2002 | Anderson ............. C23C 16/481 118/715 |
| 6,635,117 | B1 | 10/2003 | Kinnard et al. |
| 7,241,346 | B2 | 7/2007 | Hanamachi et al. |
| 2003/0092266 | A1 | 5/2003 | Anderson et al. |
| 2004/0194710 | A1 | 10/2004 | Hanamachi et al. |
| 2007/0087533 | A1 | 4/2007 | Nishikawa et al. |
| 2011/0120649 | A1 | 5/2011 | Satou et al. |
| 2012/0090691 | A1 | 4/2012 | Baluja et al. |
| 2012/0240853 | A1 | 9/2012 | Carlson et al. |
| 2013/0019803 | A1 | 1/2013 | Samir et al. |
| 2013/0109159 | A1 | 5/2013 | Carlson |
| 2013/0160948 | A1* | 6/2013 | Shih ........................ C23C 16/06 156/345.33 |

FOREIGN PATENT DOCUMENTS

| | | |
|---|---|---|
| EP | 0855452 | 7/1998 |
| EP | 1036988 | 9/2000 |
| JP | H11-045861 A | 2/1999 |
| JP | 2002-521817 A | 7/2002 |
| JP | 2002521817 A | 7/2002 |
| JP | 2004-311550 A | 11/2004 |
| JP | 2007-116151 A | 5/2007 |
| JP | 2007116151 A | 5/2007 |
| JP | 2008235830 A | 10/2008 |
| TW | 201250052 A | 12/2012 |

OTHER PUBLICATIONS

Office Action in Korean Application No. 10-2015-7029118 dated Mar. 2, 2017.
Search Report in related application CN 2014800083318 dated Mar. 27, 2017.
International Search Report and Written Opinion dated Jun. 24, 2014 for Application No. PCT/US2014/017200.
Office Action for Chinese Application No. 201610052064.5 dated May 19, 2016.
Office Action for U.S. Appl. No. 13/846,355 dated Nov. 16, 2015.
Notice of Allowance for U.S. Appl. No. 13/846,355 dated Feb. 26, 2016.

* cited by examiner

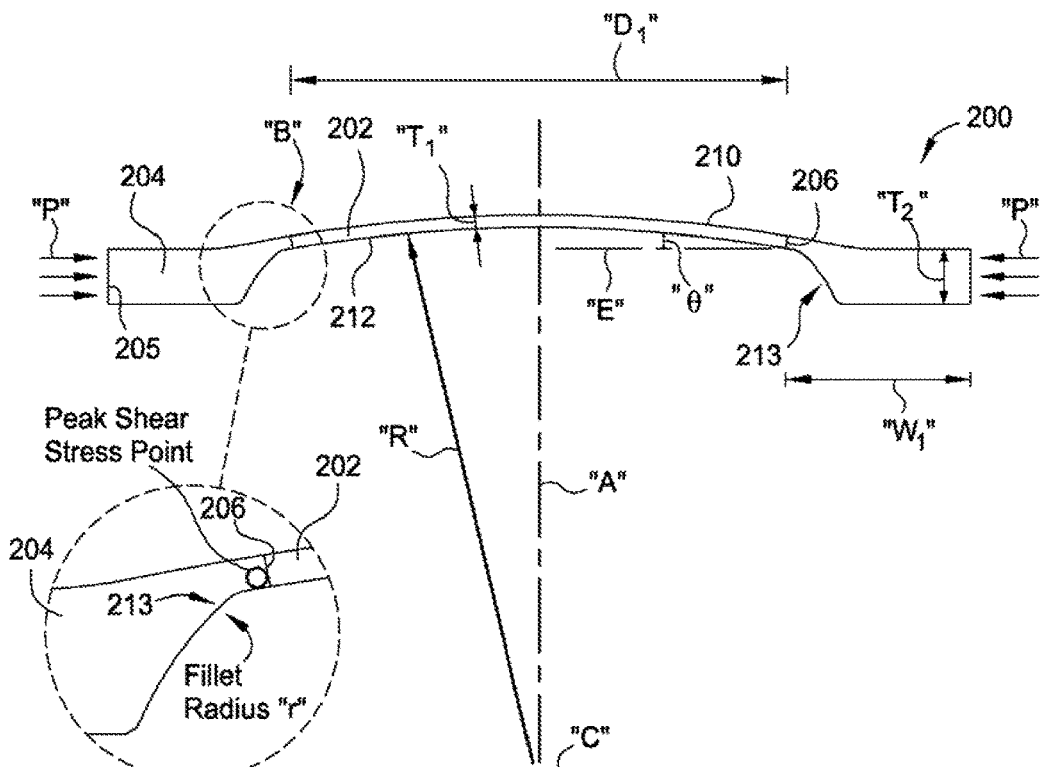
FIG. 2C
FIG. 2A
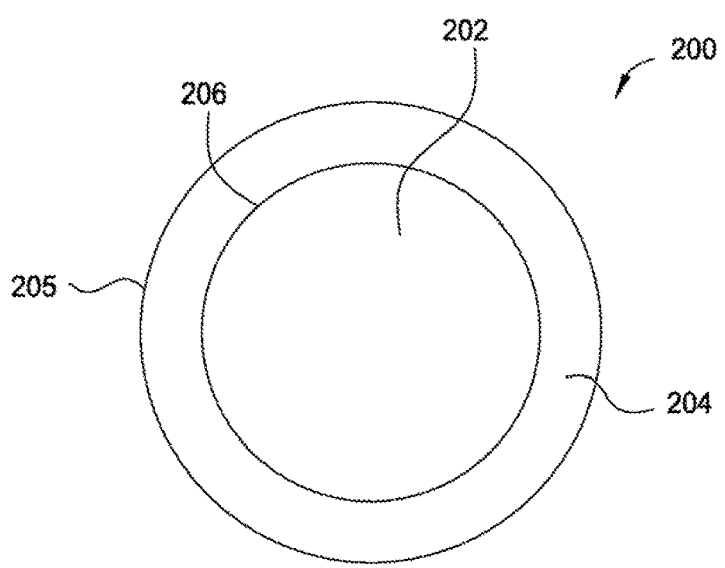
FIG. 2B

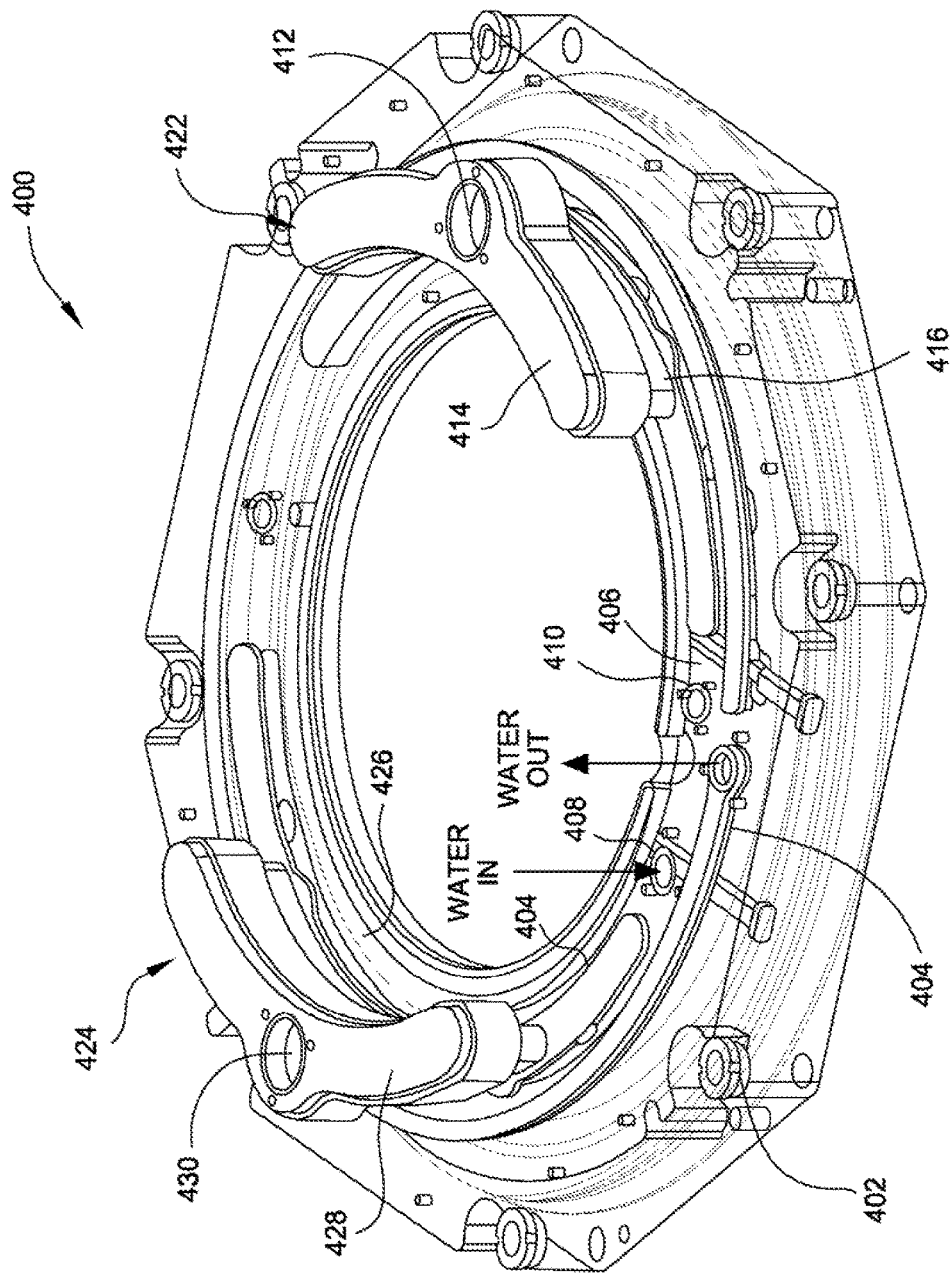

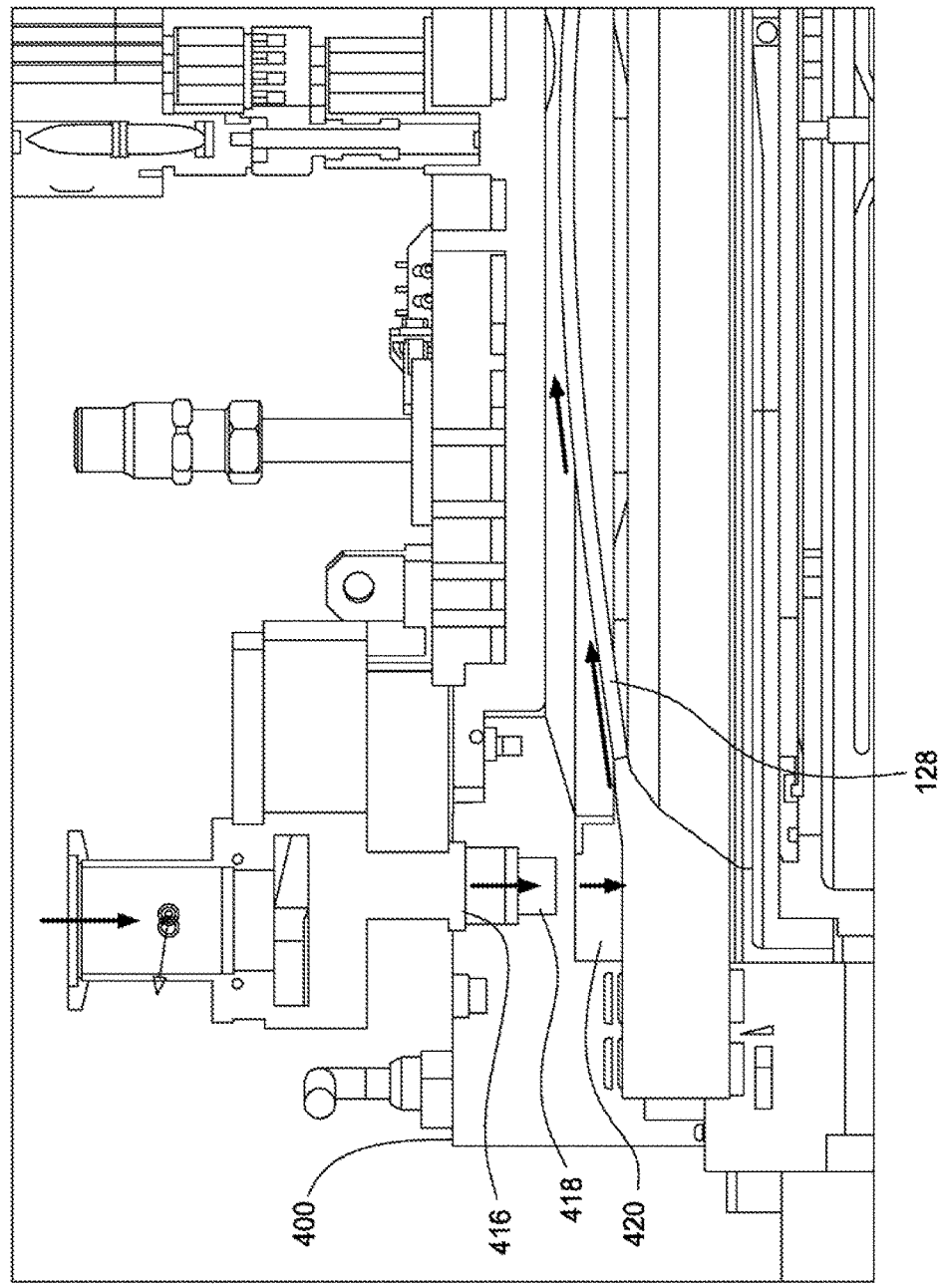

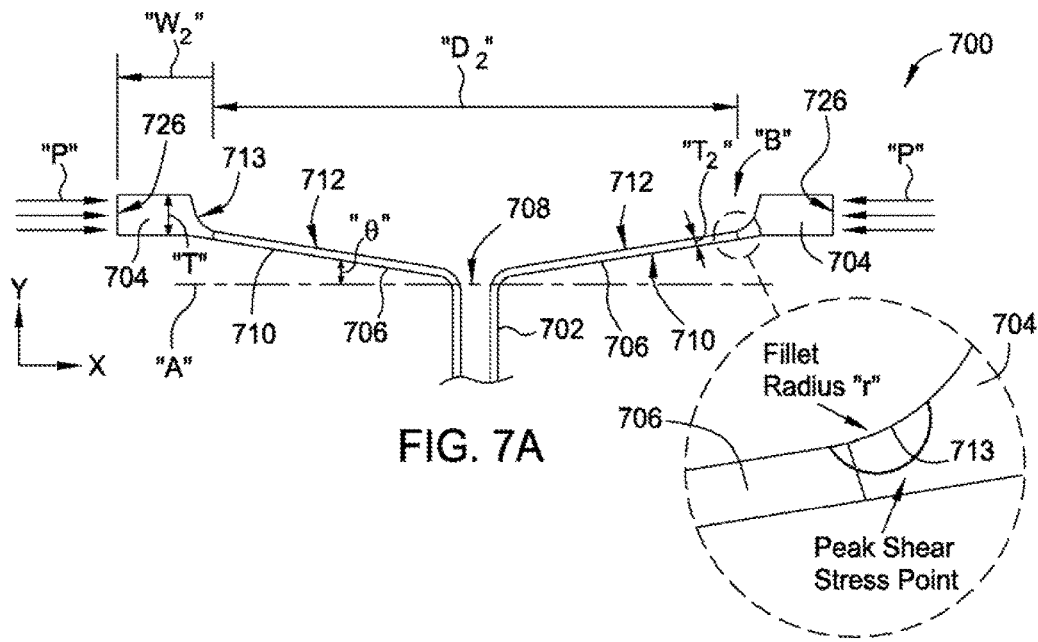
FIG. 7A
FIG. 7C
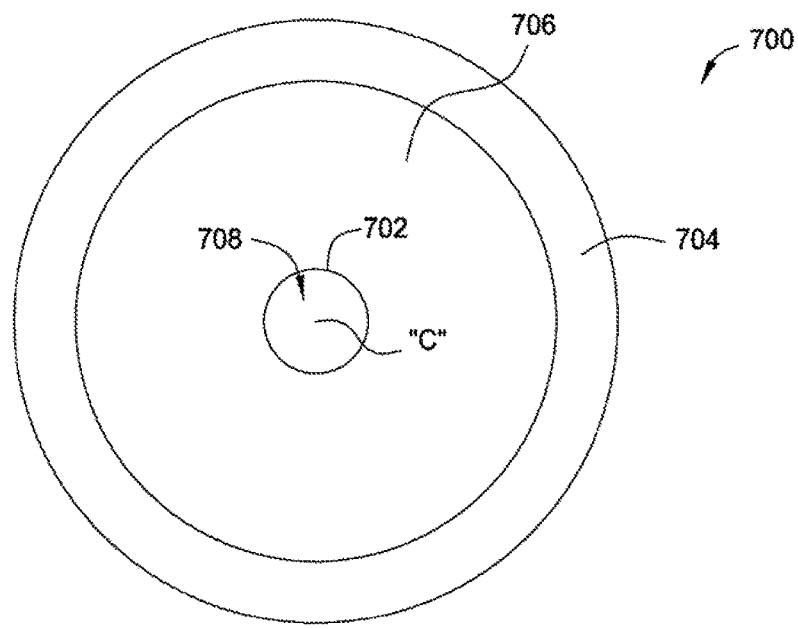
FIG. 7B

EPI BASE RING

CROSS-REFERENCE TO RELATED APPLICATIONS

This application is a continuation of U.S. Ser. No. 13/846,355, filed on Mar. 18, 2013, which claims benefit of U.S. provisional patent application Ser. No. 61/780,447, filed Mar. 13, 2013, and U.S. provisional patent application Ser. No. 61/781,960, filed Mar. 14, 2013, which are herein incorporated by reference.

BACKGROUND OF THE INVENTION

Field of the Invention

Embodiments of the present invention generally relate to a base ring assembly for use in a substrate processing chamber.

Description of the Related Art

Semiconductor substrates are processed for a wide variety of applications, including the fabrication of integrated devices and microdevices. One method of processing substrates includes depositing a material, such as a dielectric material or a conductive metal, on an upper surface of the substrate. For example, epitaxy is a deposition process that grows a thin, ultra-pure layer, usually of silicon or germanium on a surface of a substrate. The material may be deposited in a lateral flow chamber by flowing a process gas parallel to the surface of a substrate positioned on a support, and thermally decomposing the process gas to deposit a material from the gas onto the substrate surface.

The chamber design is essential for film quality in epitaxy growth which uses a combination of precision gas flow and accurate temperature control. Flow control, chamber volume, and chamber heating rely on the design of a base ring, which is typically disposed between a top dome and a lower dome (defining a processing volume for a substrate) and dictating the layouts of the process kit and inject/exhaust caps which in turn influence the epitaxial deposition uniformity. Conventional epitaxy chamber is very tall, resulting in there being a large distance between the top and bottom domes and the substrate. This results in highly non-uniform flow, turbulence, eddy currents, and an overall large chamber volume. The chamber volume limits the ability of the system to run in transient, deposition-etch switching mode and requires long chamber stabilization time, which restricts process uniformity with sudden changes in cross sectional area over the substrate which negatively influences flow uniformity, induces turbulence, and affects overall uniformity of deposition gas concentration over the substrate.

Since flow characteristics directly impact the film performance on the substrate, there is a need for a deposition apparatus which provides a balanced and uniform flow field throughout the process chamber.

SUMMARY OF THE INVENTION

Embodiments described herein generally relate to a base ring assembly for use in a substrate processing chamber. In one embodiment, the base ring assembly comprises a ring body sized to be received within an inner circumference of the substrate processing chamber, the ring body comprising a loading port for passage of the substrate, a gas inlet, and a gas outlet, wherein the gas inlet and the gas outlet are disposed at opposing ends of the ring body, and an upper ring configured to dispose on a top surface of the ring body, and a lower ring configured to dispose on a bottom surface of the ring body, wherein the upper ring, the lower ring, and the ring body, once assembled, are generally concentric or coaxial.

In another embodiment, a process kit for a substrate processing chamber is disclosed. The process kit comprises a ring body sized to be received within an inner circumference of the substrate processing chamber, the ring body comprising a loading port for passage of the substrate, a gas inlet, and a gas outlet, wherein the gas inlet and the gas outlet are disposed at opposing ends of the ring body, and an upper ring configured to dispose on a top surface of the ring body, and a lower ring configured to dispose on a bottom surface of the ring body, wherein the upper ring, the lower ring, and the ring body, once assembled, are generally concentric or coaxial.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2A illustrates a cross-sectional view of an upper dome according to one embodiment of the invention.

FIG. 2B illustrates a top view of the upper dome shown in FIG. 2A.

FIG. 2C is an enlarged view of a bonded joint illustrating the fillet radius.

FIG. 4A illustrates a perspective view of a clamp ring that may be used in place of the clamp ring of FIG. 1A according to one embodiment of the invention.

FIG. 4B illustrates openings in a lower surface communicating with a distribution plenum formed through the clamp ring.

FIGS. 7A and 7B are schematic illustrations of a lower dome that may be used in place of the lower dome of FIG. 1A according to one embodiment of the invention.

FIG. 7C is an enlarged view of a bonded joint illustrating the fillet radius.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, for purposes of explanation, numerous specific details are set forth in order to provide a thorough understanding of the present invention. In some instances, well-known structures and devices are shown in block diagram form, rather than in detail, in order to avoid obscuring the present invention. These embodiments are described in sufficient detail to enable those skilled in the art to practice the invention, and it is to be understood that other embodiments may be utilized and that logical, mechanical, electrical, and other changes may be made without departing from the scope of the present invention.

Figure 1A:
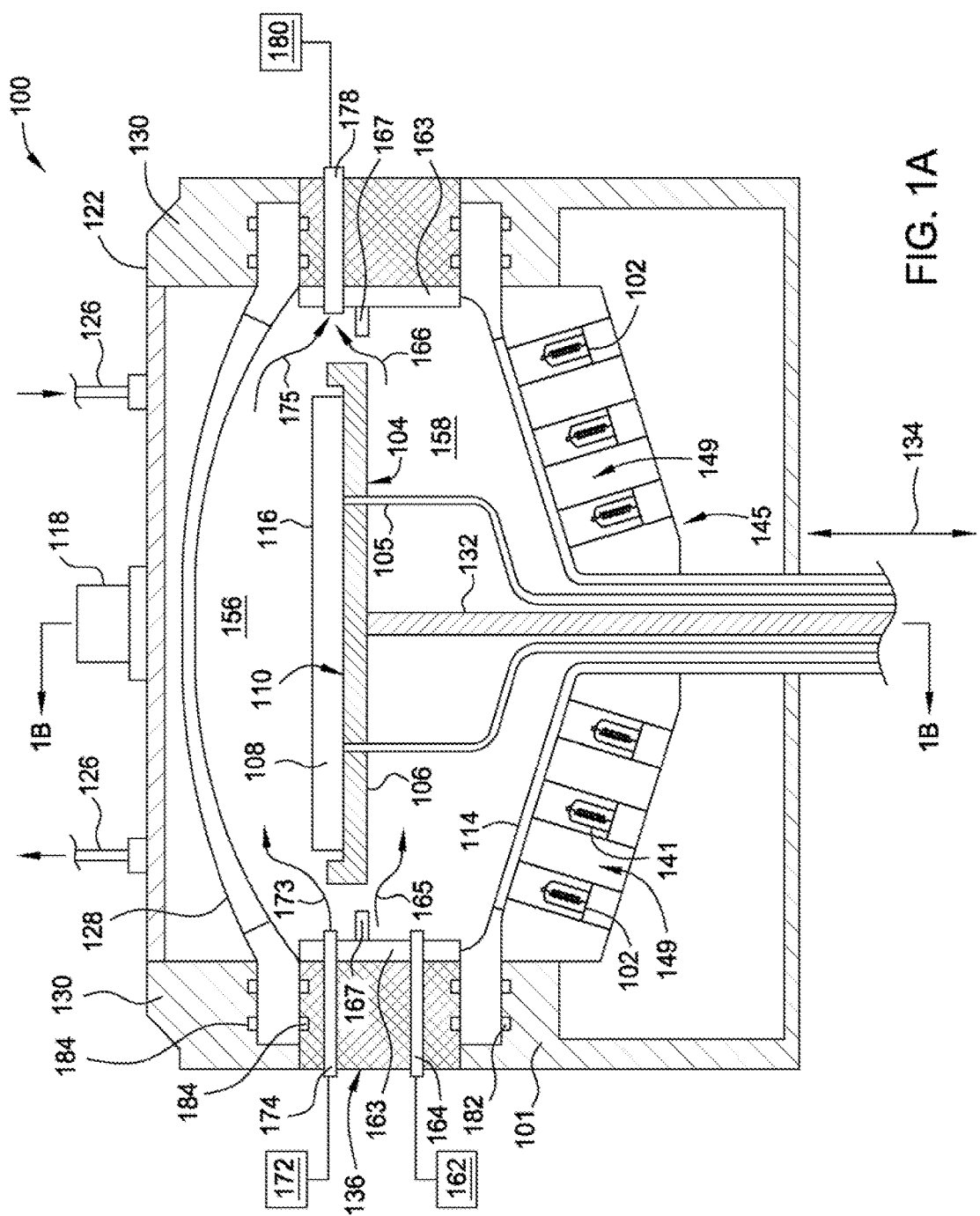
FIG. 1A is a schematic sectional view of a backside heating process chamber according to one embodiment of the invention.
Figure 1B:
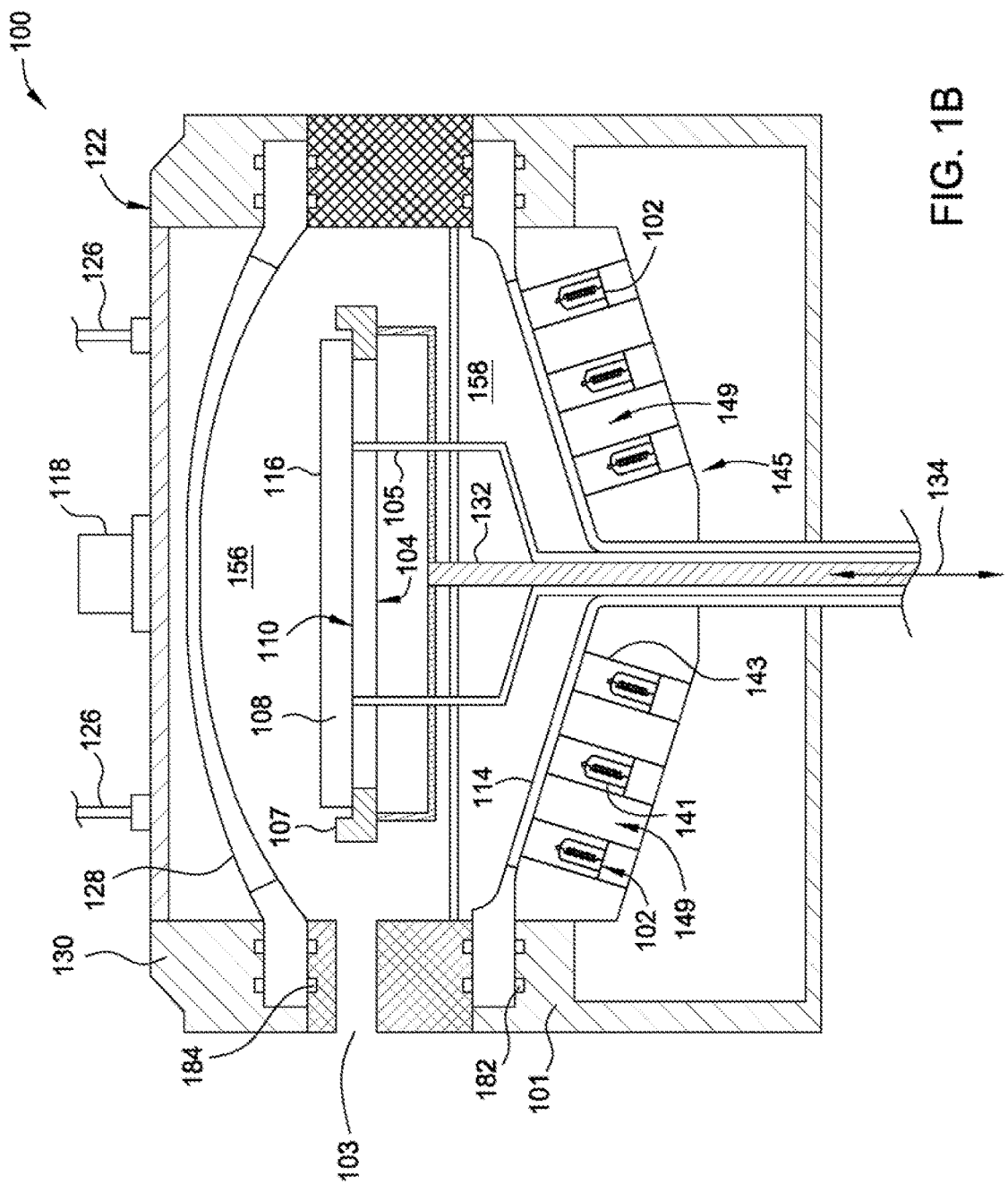
FIG. 1B illustrates a schematic side view of the process chamber taken along line 1B-1B in FIG. 1A.

FIG. 1A illustrates a schematic sectional view of a backside heating process chamber 100 according to one embodiment of the invention. FIG. 1B illustrates a schematic side view of the process chamber 100 taken along line 1B-1B in FIG. 1A. It is noted that the liner assembly 163 and the circular shield 167 has been omitted for clarity. The process chamber 100 may be used to process one or more substrates, including the deposition of a material on an upper surface of a substrate 108. The process chamber 100 may include an array of radiant heating lamps 102 for heating, among other components, a back side 104 of a substrate support 106 disposed within the process chamber 100. In some embodiments, the array of radiant heating lamps may be disposed over the upper dome 128. The substrate support 106 may be a disk-like substrate support 106 as shown, or may be a ring-like substrate support 107 with no central opening as shown in FIG. 1B, which supports the substrate from the edge of the substrate to facilitate exposure of the substrate to the thermal radiation of the lamps 102.

Exemplary Substrate Support

In some embodiments, the substrate support 106 may be a multiple arm design as shown in FIG. 10. In the embodiment shown in FIG. 10, the substrate support 190 has three support arms 192a, 192c, and 192e and three dummy arms 192b, 192d, and 192f, each of the support arms and dummy arms being extended outwardly and angularly spaced apart from each other around the axis "G" that is extending through the central shaft 194. Greater or fewer support arms or dummy arms are contemplated. The corner 196 of each of the dummy arms 192b, 192d and 192f along a lengthwise direction of the support arm may be chamfered for better optic. Each of the support arms and dummy arms 192a-192f may be at an angle "A" of about 5° to about 15° with respect to the axis "G". In one example, the angle "A" is about 10°. The end of the support arms 192a, 192c and 192e may be bended upward to confine the substrate to prevent it from lateral movement.

The dummy arms 192b, 192d and 192f generally do not contact or otherwise support the substrate. Instead, the dummy arms are designed to provide a better heat transfer balance or a more even distribution of heat from the lamps 102, thereby facilitating accurate temperature control of a substrate during processing. During processing, the substrate support 190 absorbs thermal energy from lamps utilized to heat a substrate support and/or substrate. The absorbed heat radiates from the substrate support 190. The radiated heat radiated by the substrate support 190, particularly the support arms 192a, 192c, and 192e, is absorbed by the substrate support 190 and/or substrate. Because of the relatively close position of the support arms 192a, 192c, and 192e to the substrate support 190 or substrate, heat is easily radiated to the substrate support 190, causing areas of increased temperature adjacent to the support arms 192a, 192c, and 192e. However, utilization of the dummy arms 192b, 192d and 192f facilitates a more uniform radiation of heat from the support arms 192a, 192c, and 192e to the substrate support 190 and/or substrate, and thus, the occurrence of hot spots is reduced. For example, the utilization of dummy arms 192b, 192d and 192f results in a uniform radiation of a substrate support, rather than three local hot spots adjacent the support arms 192a, 192c, and 192e.

Referring back to FIG. 1A, the substrate support 106 is located within the process chamber 100 between an upper dome 128 and a lower dome 114. The upper dome 128, the lower dome 114 and a base ring 136 that is disposed between the upper dome 128 and lower dome 114 generally define an internal region of the process chamber 100. The substrate 108 (not to scale) can be brought into the process chamber 100 and positioned onto the substrate support 106 through a loading port 103, which is obscured by the substrate support 106 in FIG. 1A but can be seen in FIG. 1B.

The substrate support 106 is shown in an elevated processing position, but may be vertically traversed by an actuator (not shown) to a loading position below the processing position to allow lift pins 105 to contact the lower dome 114, passing through holes in the substrate support 106 and the central shaft 132, and raise the substrate 108 from the substrate support 106. A robot (not shown) may then enter the process chamber 100 to engage and remove the substrate 108 therefrom though the loading port 103. The substrate support 106 then may be actuated up to the processing position to place the substrate 108, with its device side 116 facing up, on a front side 110 of the substrate support 106.

The substrate support 106, while located in the processing position, divides the internal volume of the process chamber 100 into a process gas region 156 that is above the substrate, and a purge gas region 158 below the substrate support 106. The substrate support 106 is rotated during processing by a central shaft 132 to minimize the effect of thermal and process gas flow spatial anomalies within the process chamber 100 and thus facilitate uniform processing of the substrate 108. The substrate support 106 is supported by the central shaft 132, which moves the substrate 108 in an up and down direction 134 during loading and unloading, and in some instances, processing of the substrate 108. The substrate support 106 may be formed from silicon carbide or graphite coated with silicon carbide to absorb radiant energy from the lamps 102 and conduct the radiant energy to the substrate 108.

In general, the central window portion of the upper dome 128 and the bottom of the lower dome 114 are formed from an optically transparent material such as quartz. As will be discussed in more detail below with respect to FIG. 2A, the thickness and the degree of curvature of the upper dome 128 may be configured in accordance with the present invention to provide a flatter geometry for uniform flow uniformity in the process chamber.

One or more lamps, such as an array of lamps 102, can be disposed adjacent to and beneath the lower dome 114 in a specified, optimal desired manner around the central shaft 132 to independently control the temperature at various regions of the substrate 108 as the process gas passes over, thereby facilitating the deposition of a material onto the upper surface of the substrate 108. While not discussed here in detail, the deposited material may include gallium arsenide, gallium nitride, or aluminum gallium nitride.

The lamps 102 may be configured to include bulbs 141 and be configured to heat the substrate 108 to a temperature within a range of about 200 degrees Celsius to about 1600 degrees Celsius. Each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 conductively and radiatively cools the lower dome 104 due in part to the close proximity of the lamphead 145 to the lower dome 104. The lamphead 145 may also cool the lamp walls and walls of the reflectors (not shown) around the lamps. Alternatively, the lower dome 104 may be cooled by a convective approach known in the industry. Depending upon the application, the lampheads 145 may or may not be in contact with the lower dome 114. Further descriptions of the lampheads 145 are discussed below with respect to FIGS. 5A and 5B.

A circular shield 167 may be optionally disposed around the substrate support 106 and surrounded by a liner assembly 163. The shield 167 prevents or minimizes leakage of heat/light noise from the lamps 102 to the device side 116 of the substrate 108 while providing a pre-heat zone for the process gases. The shield 167 may be made from CVD SiC, sintered graphite coated with SiC, grown SiC, opaque quartz, coated quartz, or any similar, suitable material that is resistant to chemical breakdown by process and purging gases.

The liner assembly 163 is sized to be nested within or surrounded by an inner circumference of the base ring 136. The liner assembly 163 shields the processing volume (i.e., the process gas region 156 and purge gas region 158) from metallic walls of the process chamber 100. The metallic walls may react with precursors and cause contamination in the processing volume. While the liner assembly 163 is shown as a single body, the liner assembly 163 may include one or more liners as will be discussed below with respect to FIGS. 3A-3C and 6.

As a result of backside heating of the substrate 108 from the substrate support 106, the use of an optical pyrometer 118 for temperature measurements/control on the substrate support can be performed. This temperature measurement by the optical pyrometer 118 may also be done on substrate device side 116 having an unknown emissivity since heating the substrate front side 110 in this manner is emissivity independent. As a result, the optical pyrometer 118 can only sense radiation from the hot substrate 108 that conducts from the substrate support 106, with minimal background radiation from the lamps 102 directly reaching the optical pyrometer 118.

A reflector 122 may be optionally placed outside the upper dome 128 to reflect infrared light that is radiating off the substrate 108 back onto the substrate 108. The reflector 122 may be secured to the upper dome 128 using a clamp ring 130. Detail descriptions of the clamp ring 130 are further discussed below with respect to FIGS. 4A and 4B. The reflector 122 can be made of a metal such as aluminum or stainless steel. The efficiency of the reflection can be improved by coating a reflector area with a highly reflective coating such as with gold. The reflector 122 can have one or more machined channels 126 connected to a cooling source (not shown). The channel 126 connects to a passage (not shown) formed on a side of the reflector 122. The passage is configured to carry a flow of a fluid such as water and may run horizontally along the side of the reflector 122 in any desired pattern covering a portion or entire surface of the reflector 122 for cooling the reflector 122.

Process gas supplied from a process gas supply source 172 is introduced into the process gas region 156 through a process gas inlet 174 formed in the sidewall of the base ring 136. The process gas inlet 174 is configured to direct the process gas in a generally radially inward direction. During the film formation process, the substrate support 106 may be located in the processing position, which is adjacent to and at about the same elevation as the process gas inlet 174, allowing the process gas to flow up and round along flow path 173 across the upper surface of the substrate 108 in a laminar flow fashion. The process gas exits the process gas region 156 (along flow path 175) through a gas outlet 178 located on the side of the process chamber 100 opposite the process gas inlet 174. Removal of the process gas through the gas outlet 178 may be facilitated by a vacuum pump 180 coupled thereto. As the process gas inlet 174 and the gas outlet 178 are aligned to each other and disposed approximately at the same elevation, it is believed that such a parallel arrangement, when combing with a flatter upper dome 128 (as will be discussed in detail below), will enable a generally planar, uniform gas flow across the substrate 108. Further radial uniformity may be provided by the rotation of the substrate 108 through the substrate support 106.

Exemplary Gas Inlet with Angled Injection

Figure 3A:
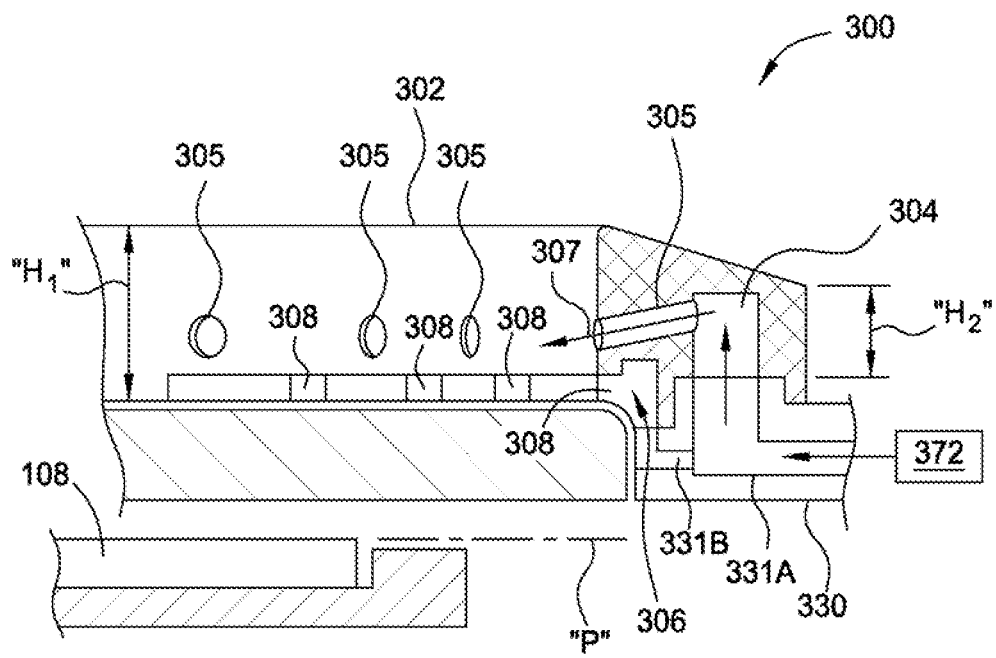
FIG. 3A illustrates a partial perspective cross-sectional view of a gas inlet mechanism that may be used in the process chamber of FIG. 1A according to one embodiment of the invention.
Figure 3B:
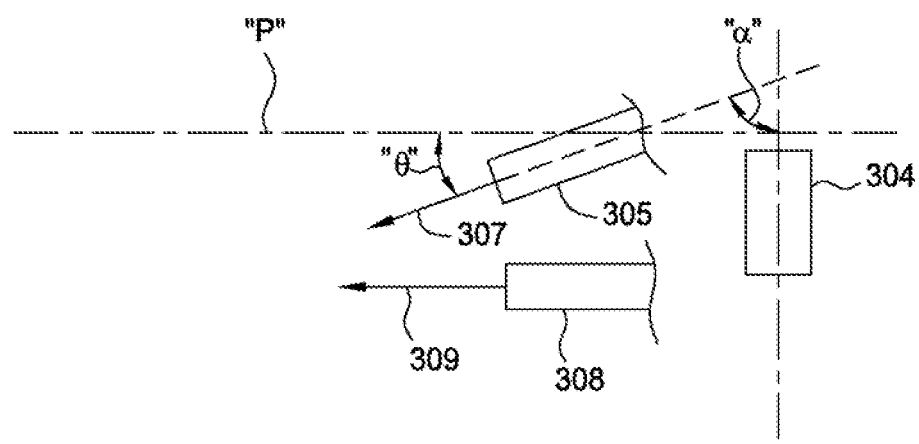
FIG. 3B illustrates secondary inlet of the first inlet channel being configured at an angle ($\alpha$) with respect to a vertical passage of the first inlet channel.
Figure 3C:
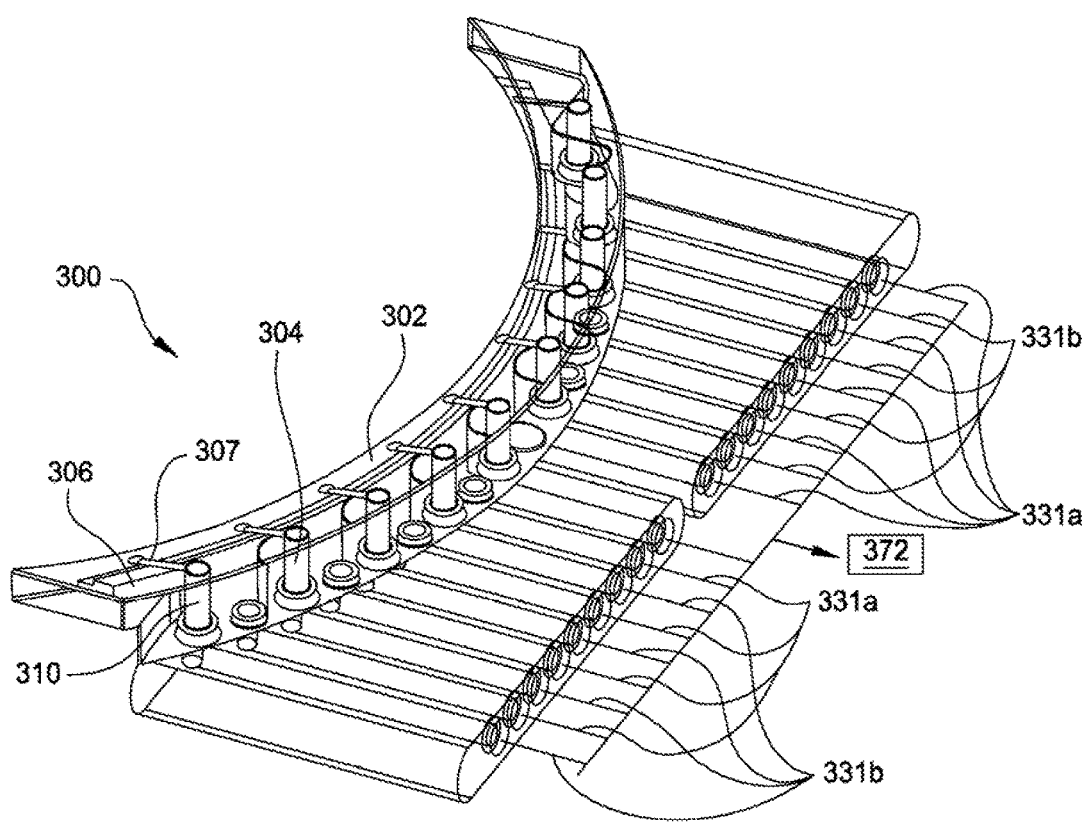
FIG. 3C illustrates a first inlet channel and a second inlet channel are in fluid communication with a process gas supply source.

In some embodiments, the process gas supply source 172 may be configured to supply multiple types of process gases, for example, a group III precursor gas and a group V precursor gas. The multiple process gases may be introduced into the process chamber 100 through the same process gas inlet 174, or through separate gas inlets. In cases where separate gas inlets are desired, an alternative approach may be adapted to improve the mixing of process gases in the process chamber. FIG. 3A illustrates a partial perspective cross-sectional view of a gas inlet mechanism 300 according to one embodiment of the invention that may be used in the process chamber of FIGS. 1A and 1B to provide one or more fluids, such as a process gas or a plasma of a gas, to the processing volume (e.g., process gas region 156 and purge gas region 158). The gas inlet mechanism 300 may serve as an injector liner, such as the injector liner 614 of the liner assembly 600 of FIG. 6, and may rest on or be supported by an inject insert liner assembly 330 that is in fluid communication with a process gas supply source 372, such as the process supply source 172 of FIG. 1A. As can be better seen in FIG. 3C, the inject insert liner assembly 330 may include a first set of gas passage 331a and a second set of gas passage 331b that are configured to deliver different process gases in a controlled manner.

In general, the gas inlet mechanism 300 is disposed at locations where the process gas(es) is to be introduced into the process chamber. The gas inlet mechanism 300 includes a body 302 having a first inlet channel 304 and a second inlet channel 306. The first inlet channel 304 and the second inlet channel 306 are in fluid communication with one or more process gas supply sources 372. The body 302 generally goes around a portion of the inner circumference of the process chamber 100. The body 302 includes a cylindrical inner diameter that is sized to be fitted in the cut-outs of an upper liner and an exhaust liner (e.g., the upper liner 608 and the exhaust liner 612 of FIG. 6). Therefore, the body 302 is removably combined with the exhaust liner and the upper liner of the liner assembly. Further details of the liner assembly are discussed below with respect to FIG. 6.

The first inlet channel 304 has a longitudinal axis that is substantially orthogonal to the longitudinal axis of a first gas passage 332, which is formed within the inject insert liner assembly 330. A first process gas may be flowed from the process gas supply source 372 through the first set of gas passage 331a into the first inlet channel 304, which is in fluid communication with a first inlet 305. The first inlet 305 is configured to provide the first process gas into the process chamber, for example, the process gas region 156 as shown in FIG. 1A. The gas inlet mechanism 300 may have one or more first inlets 305, for example, about 3 to 20 first inlets, each connects to respective first inlet channel and gas passage to the process gas supply source 372. Greater or fewer first inlets 305 are contemplated.

The first process gas may be a specific process gas or a mixture of several process gases. Alternatively, one or more first inlets 305 may provide one or more process gases that are different than at least one other first inlet, depending upon the application. In one embodiment, each first inlet 305 is configured at an angle "θ" with respect to a horizontal plane "P" that is generally parallel to a longitudinal direction of a substrate 108, such that the first process gas, after existing the first inlet 305, is flowing at an angle along a first direction 307 as shown. In one example, the angle "θ" between a longitudinal direction of the first inlet 305 and the horizontal plane "P" is less than about 45°, such as about 5° to about 30°, for example about 15°. In the example shown in FIG. 3B, the first inlet 305 is configured at an angle (α) with respect to the first inlet channel 304 by about 25° to about 85°, for example about 45° to about 75°.

The second inlet channel 306 may be substantially similar in design to the first inlet channel 304 in terms of the number of the gas inlets and process gas to be introduced. For example, the second inlet channel 306 may be in fluid communication with one or more process gas supply sources 372. A second process gas, which may be a mixture of several process gases, may be flowed from the process gas supply source 372 through the second set of gas passage 331b into the second inlet channel 306, which is in fluid communication with a second inlet 308. Alternatively, one or more second inlets 308 may provide one or more process gases that are different than at least one other second inlet. The second inlet 308 is configured to provide the second process gas into the process chamber, for example, the process gas region 156 as shown in FIG. 1A. Particularly, each second inlet 308 is configured to provide the second process gas in a second direction 309 that is different from the first direction 307 (see FIG. 3B) after existing the second inlet 308. The second direction 309 is generally parallel to the horizontal plane "P" that is parallel to a longitudinal direction of the substrate.

Similarly, the gas inlet mechanism 300 may have one or more second inlets 308, for example, about 3 to 20 second inlets, each connects to respective second inlet channel and gas passage to the process gas supply source 372. Greater or fewer second inlets 308 are contemplated.

It is contemplated that the flow rate, process gas composition and the like at each first and second inlets 305, 308 may be independently controlled. For example, in some examples some of the first inlets 305 may be idle or pulsed during processing to achieve a desired flow interaction with a second process gas that is provided by the second inlets 308. In some cases where the first and second inlet channels 304, 306 include only a single secondary inlet, the secondary inlet may be pulsed for similar reasoning as discussed above.

The first inlets 305 of the first inlet channel 304 and the second inlets 308 of the second inlet channel 306 may be disposed vertically offset with respect to each other along the inner circumference of the process chamber. Alternatively, the first inlets 305 of the first inlet channel 304 and the second inlets 308 of the second inlet channel 306 may be disposed in vertical alignment to one another. In either case, the first and second inlets 305, 308 are arranged such that the first process gas from the first inlets 305 is properly mixed with the second process gas from the second inlets 308. It is believed that mixing of the first and second process gases is also improved due to the angular design of the first inlet 305. The first inlets 305 of the first inlet channel 304 may be in a closer proximity to the second inlets 308 of the second inlet channel 306. However, it may be advantageous in certain embodiments to provide a proper distance between the first and second inlets 305 and 308 to prevent the first process gas and the second process gas from mixing together too early immediately after existing the inlets.

The body 302 of the gas inlet mechanism 300 may have a reduced height to match with the near-flat configuration of the upper dome, as discussed below with respect to FIG. 2A. In one embodiment, the overall height of the body 302 may be between about 2 mm to about 30 mm, such as about 6 mm to about 20 mm, for example about 10 mm. The height "$H_1$" on the side of the body 302 facing the process gas region 156 may be of about 2 mm to about 30 mm, for example about 5 mm to about 20 mm. Since the height of the body 302 is reduced, the height of the first inlet channel 304 may be reduced accordingly to maintain the strength. In one example, the height "$H_2$" of the first inlet channel 304 is about 1 mm to about 25 mm, for example about 6 mm to about 15 mm. Lowering the outer passage 310 will result in a shallower angle of injection.

Referring back to FIG. 1A, purge gas may be supplied from a purge gas source 162 to the purge gas region 158 through an optional purge gas inlet 164 (or through the process gas inlet 174) formed in the sidewall of the base ring 136. The purge gas inlet 164 is disposed at an elevation below the process gas inlet 174. If the circular shield 167 or a pre-heat ring (not shown) is used, the circular shield or the pre-heat ring may be disposed between the process gas inlet 174 and the purge gas inlet 164. In either case, the purge gas inlet 164 is configured to direct the purge gas in a generally radially inward direction. During the film formation process, the substrate support 106 may be located at a position such that the purge gas flows down and round along flow path 165 across back side 104 of the substrate support 106 in a laminar flow fashion. Without being bound by any particular theory, the flowing of the purge gas is believed to prevent or substantially avoid the flow of the process gas from entering into the purge gas region 158, or to reduce diffusion of the process gas entering the purge gas region 158 (i.e., the region under the substrate support 106). The purge gas exits the purge gas region 158 (along flow path 166) and is exhausted out of the process chamber through the gas outlet 178, which is located on the side of the process chamber 100 opposite the purge gas inlet 164.

Similarly, during the purging process the substrate support 106 may be located in an elevated position to allow the purge gas to flow laterally across the back side 104 of the substrate support 106. It should be appreciated by those of ordinary skill in the art that the process gas inlet, the purge gas inlet and the gas outlet are shown for illustrative purpose, since the position, size, or number of gas inlets or outlet etc. may be adjusted to further facilitate a uniform deposition of material on the substrate 108.

If desired, the purge gas inlet 164 may be configured to direct the purge gas in an upward direction to confine process gases in the process gas region 156.

Exemplary Clamp Ring

FIG. 4A is a perspective view of a clamp ring 400 that may be used in place of the clamp ring 130 of FIG. 1A according to one embodiment of the invention. The clamp ring 400 is disposed relatively above a base ring (e.g., the base ring of FIGS. 1A-1B and 8A-8C) and is fastened to the chamber 100 by fastening receptacles 402 disposed around the clamp ring 400. Fasteners (not shown) are disposed through the fastening receptacles 402 and into recesses in the sidewall of the process chamber 100 to secure the clamp ring 400 to the process chamber 100.

The clamp ring 400 may provide with cooling features, such as cooling conduits 404. Cooling conduits 404 circulate a cooling fluid, such as water, through and around the clamp ring 400. The cooling fluid is introduced to the cooling conduits 404 through an inlet 408 and circulates through the conduits 404 to emerge through an outlet 410. The cooling conduits 404 may be connected by a ramp 406 that allows the cooling fluid to flow from one of the conduits 404 to the other conduit 404.

In the embodiment of FIG. 4A, one conduit 404 is disposed around an inner portion of the clamp ring 400 while a second conduit 404 is disposed around an outer portion of the clamp ring 400. Cooling fluid is introduced to the conduit 404 disposed around the inner portion of the clamp ring 400 because the inner portion of the clamp ring 400 is exposed to the most heat, being nearest to the process conditions of the chamber 100. The cooling fluid absorbs heat from the inner portion of the clamp ring 400 most efficiently because the cooling fluid is introduced at a relatively low temperature. When the cooling fluid reaches the conduit 404 disposed around the outer portion of the clamp ring 400, the cooling fluid has risen in temperature, but the cooling fluid still regulates the temperature of the outer portion of the clamp ring 400, which is heated less than the inner portion. In this way, the cooling fluid is flowed in a countercurrent fashion through the clamp ring 400.

The clamp ring 400 of FIG. 4A also has gas flow features provided to cool the upper dome 128. An inlet manifold 422 for a cooling gas applies cooling gas to the upper dome 128 of the chamber 100. A gas inlet 412 communicates with an inlet plenum 414, which distributes the gas along the inlet plenum 414. Openings in a lower surface 416 (the openings are not shown) communicate with a distribution plenum 418 formed through the clamp ring 400, which is shown in FIG. 4B.

FIG. 4B is a cross-sectional view of the lid portion of a processing chamber according to another embodiment. The lid portion includes the clamp ring 400. Gas flows into the distribution plenum 418 and into an inlet plenum 420 proximate to a periphery of the upper dome 128. Gas flows along an upper surface of the upper dome 128 regulating the temperature of the upper dome 128.

Referring again to FIG. 4A, the gas flows into an exit manifold 424 that has an outlet plenum 426 in communication with a collection plenum 428 and a gas outlet 430. Regulating the thermal state of the upper dome 128 prevents thermal stresses from exceeding tolerance and reduces deposition on the lower surface of the upper dome 128. Reducing deposition on the upper dome 128 maintains energy flux through the upper dome 128 to the reflector 122 and back through the upper dome 128 at nominal levels, minimizing temperature anomalies and non-uniformities in the substrate 108 during processing.

Exemplary Lamphead Assembly

Figure 5A:
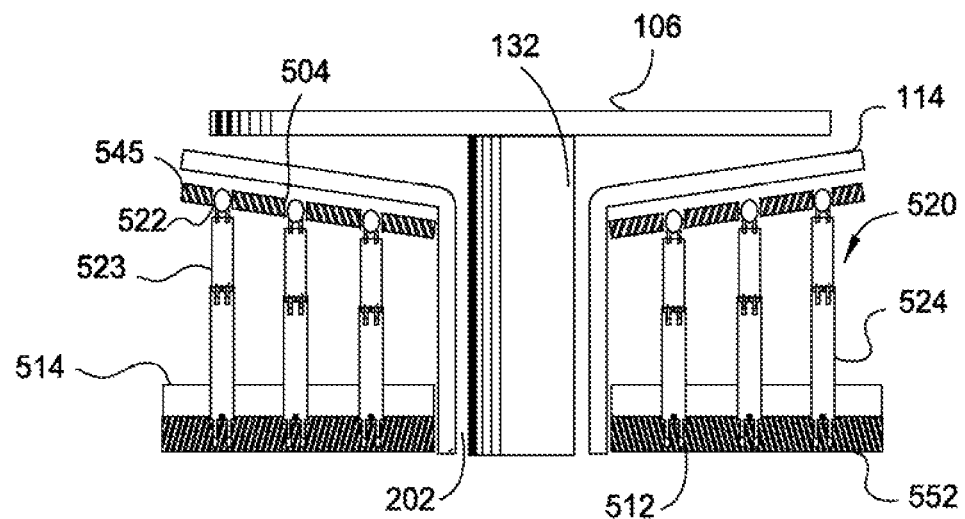
FIGS. 5A and 5B are schematic illustrations of the one or more lamp assemblies including one or more flexible standoffs, according to one embodiment.
Figure 5B:
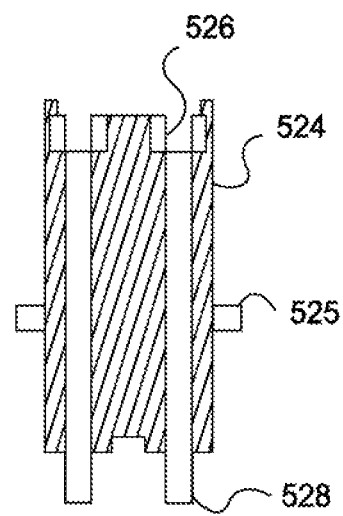

FIGS. 5A and 5B are schematic illustrations of the one or more lamp assemblies 520 that may be used in place of the lamphead 145 of FIG. 1A, according to one embodiment of the invention. The lamp assemblies 520 include one or more flexible standoffs 524. FIG. 5A illustrates a cross-sectional view of a lower dome 114 with a lamphead 545 and a printed circuit board 552 according to one embodiment. As will be discussed below, each of the lamp assemblies 520 can be attached to a flexible standoff 524, which may have a different height in accordance with the angle of the lower dome 114 used. The lamp assembly 520, the flexible standoff 524 and the lamphead 545 are part of the lamphead assembly, alongside other components such as a reflector (not shown). FIG. 5B illustrates the one or more flexible standoffs 524 connected to the one or more lamp assemblies 520 according to one embodiment. As will be described below with respect to FIGS. 7A-7B, the lower dome 114 can be formed in the shape of a generally circular, shallow martini glass or funnel with a central opening 702. The lamp assembly 520 is disposed adjacent to and beneath the lower dome 114 in a specified, optimal desired manner around the central shaft (e.g., the central shaft 132 of FIG. 1A) to independently control the temperature at various regions of the substrate.

FIG. 5A depicts the lower dome 114, the PCB 552 and one or more lamp assemblies 520, shown here as six lamp assemblies 520. It will be clear to one skilled in the art that certain elements have been left out of the description for sake of clarity. The PCB 552 can be any standard circuit board designed to control the power distribution to the one or more lamp assemblies 520. The PCB 552 can further comprise one or more connection slots 512, shown here as six connection slots, for connection with the one or more lamp assemblies 520. Though the PCB 552 is depicted here as being flat, the PCB may be shaped according to the needs of the processing chamber. In one embodiment, the PCB board is positioned parallel to the lamphead 545.

Each of the one or more lamp assemblies 520 generally includes a lamp bulb 522 and a lamp base 523. The lamp bulb 522 can be a lamp capable of heating and maintaining the substrate at a specified temperature, such as a halogen lamp, an infrared lamp and the like which are adapted as heating devices. The lamp assemblies 520 can be connected with one or more flexible standoffs 524, described in more detail with reference in FIG. 5B.

The lower dome 114 can be comprised of a translucent material, such as quartz and can incorporate one or more elements described in this disclosure with reference to lower dome. The lower dome can be between 4 and 6 mm thick. The lamphead 545 can be positioned under and in close proximity to the lower dome 114. In one embodiment, the lamphead 545 is approximately 1 mm from the lower dome 114.

The lamphead 545 has a plurality of fixed lamphead positions 504 which assure a specific position and orientation of the lamp bulb 522. The lamphead 545 can have as many as 400 or more fixed lamphead positions 504. The fixed lamphead positions 504 can be in a multiple concentric circle orientation. The fixed lamphead positions 504 can increase in depth as the holes extend from the inner radius to the outer radius. The fixed lamphead positions 504 can be bored holes in the lamphead 545. In one embodiment, the lamp bases 523 are held in a fixed orientation by the lamphead 545 and cooled by the lamphead 545.

The lamp assemblies 520 and the connection slots 512 are shown as a set of six, this number is not intended to be limiting. There can be more or fewer of each, as is needed to maintain proper substrate temperature. Further, it is important to understand that this is a side view of a three dimensional structure. As such, though the components appear to be positioned in a linear fashion, any position or combination of positions is possible. For example, on a circular PCB 552, the lamps may be positioned at a 3 cm interval on both the X and Y axis, thus filling the circle. One skilled in the art will understand that there are numerous variations of this embodiment.

FIG. 5B depicts the flexible standoff 524 according to one embodiment. The flexible standoff 524 shown here comprises a socket 526 and a contact adapter 528. The flexible standoffs 524, are depicted here as having a standard millmax socket at socket 526 and an equivalent contact adaptor at contact adapter 528, thus creating the lamp/standoff interface and the standoff/PCB interface. However, this design choice is not intended to be limiting. The socket design can be one of a number of existing designs or designs yet to be created which are capable of transmitting power from a power source to the lamp 522. In one embodiment, the flexible standoff is permanently attached to the PCB 545, such as by soldering.

The flexible standoffs 524 can be composed of both conductive and nonconductive components such that the lamps receive power from the power source. In one example, conductive metals, such as brass or copper, is used to transmit power to the lamp 522 and the conductive metal is surrounded by a nonconductive housing, such as a housing made of plastic, flexible glass or ceramic fiber or beads. The flexible standoffs 524 can be of various lengths as appropriate for proper radiance delivery to the lower dome 114. Since the flexible standoffs 524 vary in length, the lamp assembly 520 can maintain the same general size and shape along the lower dome 114

Furthermore, the flexible standoffs 524 need not be straight. The flexible standoffs 524 can take on curvature so that the lamp axis need not be parallel to that of the processing chamber central axis. Stated another way, the flexible standoffs 524 can allow the lamp axis to take on a desired polar angle(s). The flexible standoffs 524 described herein can be composed of a flexible material, such as a plastic with an elastomer.

The flexible standoffs 524 described herein can provide benefits in both interchangeability and orientation. The flexible standoffs 524, when incorporating either a bent structure or a flexible material, may be connected with a lamphead 545 with fixed lamphead positions 504 which are not oriented perpendicular to the PCB 552. Further, the flexible standoffs 524 are designed to be non-consumable. When the lamp assembly 520 fails, the lamp assembly 520 can be replaced by a single size of lamp assembly 520, thus making the lamp assembly 520 interchangeable in the chamber, regardless of the position of the lamp assembly 520 on the PCB 552 or in the lamphead 545.

The flexible standoffs 524 provide proper positioning between the fixed lamphead positions 504, formed in the lamphead 545, and the connection slots 512 formed in the PCB 552. The lamphead 545 can be composed of a thermally conductive material, such as copper. In another embodiment, the lamphead 545 can be a copper conical section or an annulus of revolution which has an inner radius which bring the lamphead 545 in close proximity to the central shaft 132 and an outer radius which is approximately in line with the edge of the lower dome 114.

Formed over the PCB 552 can be one or more support structures, such as a spacer 514. The spacer 514, as shown in this example, can work in conjunction with the PCB 552 and the lamp assembly 520 to maintain a specific direction of the lamp bulb 522, such as maintaining the lamp assemblies 520 in a vertical direction. Further, the flexible standoff 524 can have one or more structures which interact with the spacer 514, such as a lip 525. In this embodiment, the lip 525 ensures complete insertion of the flexible standoff and maintains direction of both the flexible standoff 524 and the lamp bulb 522.

Exemplary Liner Assembly

Figure 6:
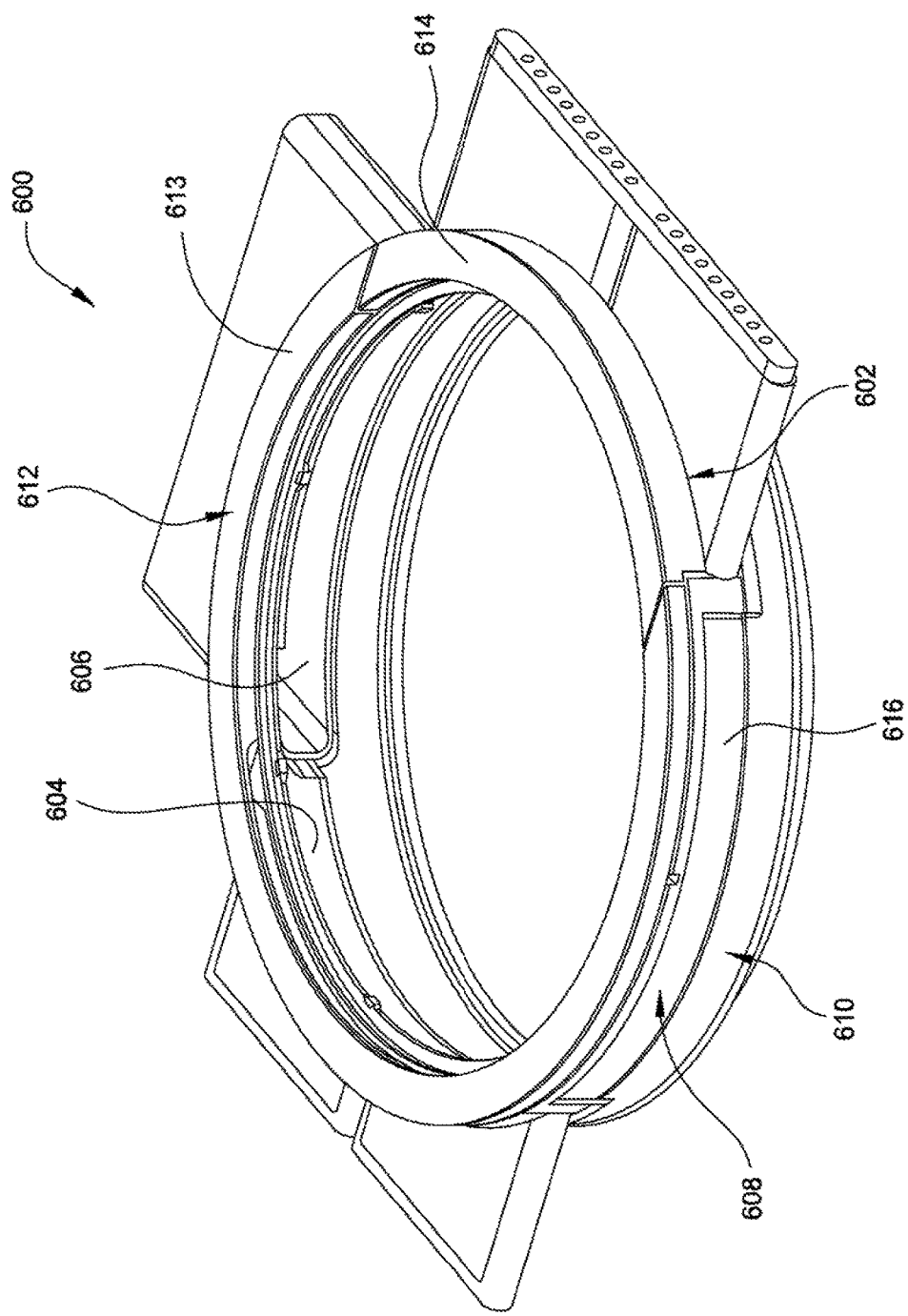
FIG. 6 illustrates a perspective view of a liner assembly that can be used in place of the liner assembly of FIG. 1 according to one embodiment of the invention.

FIG. 6 illustrates a perspective view of a liner assembly that can be used in place of the liner assembly 163 of FIG. 1A according to one embodiment of the invention. The liner assembly 600 is configured for lining a processing region within a process chamber, such as the processing chamber of FIGS. 1A and 1B. The liner assembly 600 generally provides a gas inlet port 602, a gas outlet port 604, and a loading port 606. The liner assembly 600 may work in conjunction with the base ring of FIGS. 8A-8C so that the position of the gas inlet port 602, gas outlet port 604 and loading port 606 generally matches the process gas inlet 874, the gas outlet 878, and the loading port 803, respectively, at substantially the same elevation. Same level gas inlet/outlet enables shorter flow path to the process chamber, enabling high conductance exhaust and inject. Therefore, laminar gas flow and transitions are more controlled.

The liner assembly 600 may be nested within or surrounded by a base ring (e.g., the base ring of FIGS. 1A-1B and 8A-8C) disposed in the process chamber. The liner assembly 600 may be formed as an integral piece, or may comprise multiple pieces that can be assembled together. In one example, the liner assembly 600 comprises multiple pieces (or liners) that are modular and are adapted to be replaced individually or collectively to provide additional flexibility and cost savings due to the modular design. Modular design of the liner assembly 600 enables easy serviceability and increased functionality (i.e. changing of different injectors, such as the secondary inlets 305 shown in FIG. 3A). In one embodiment, the liner assembly 167 comprises at least an upper liner 608 and a lower liner 610 that are stacked vertically. An exhaust liner 612 may be combined by part of the upper liner 608 to improve position stability.

The upper liner 608 and the exhaust liner 612 may be cut-out to receive an injector liner 614. The injector liner 614 generally corresponds to the body 302 of FIG. 3A, and may include a gas inlet mechanism, such as the gas inlet mechanism 300 discussed above with respect to FIG. 3A-3C. Each of the upper liner 608, the lower liner 610, the exhaust liner 612 and the injector liner 614 includes a generally cylindrical outer diameter that is sized to be nested within the base ring (not shown). Each of the liners 608, 610, 612, 614 may be supported by the base ring by gravity and/or interlocking devices (not shown), such as protrusions and mating recesses formed in or on some of the liners 608, 610, 612. Interior surfaces 603 of the upper liner 608 and the lower liner 610 are exposed to the processing volume (e.g., the process gas region 156 and the purge gas region 158).

In one embodiment, the upper liner 608 may be provided with a recessed feature 616 to enable purging capability on the upper liner 608, thereby preventing unwanted deposition on the liner assembly while controlling the temperature of the liner assembly.

Exemplary Upper Dome

FIGS. 2A and 2B are schematic illustrations of an upper dome 200 that may be used in place of the upper dome 128 of FIG. 1A according to one embodiment of the invention. FIG. 2A illustrates a cross-sectional view of the upper dome 200. FIG. 2B illustrates a top view of the upper dome 200. As can be seen in FIG. 2B, the upper dome 200 has a substantial circular shape and has a slightly convex outside surface 210 and a slightly concave inside surface 212 (FIG. 2A). As will be discussed in more detail below, the convex outside surface 210 is sufficiently curved to oppose the compressive force of the exterior atmosphere pressure against the reduced internal pressure in the process chamber during substrate processing, while flat enough to promote the orderly flow of the process gas and the uniform deposition of the reactant material. The upper dome 200 generally includes a central window portion 202 which passes the heat radiations, and a peripheral flange 204 for supporting the central window portion 202. The central window portion 202 is shown as having a generally circular periphery. The peripheral flange 204 engages the central window portion 202 around a circumference of the central window portion 202 along a support interface 206. In one embodiment, the peripheral flange 204 is sealed within the side walls of the process chamber by an O-ring (labeled with 184 in FIG. 1A) disposed between the peripheral flange and the side walls, to provide seal for preventing the processing gas within the process chamber from escaping into the ambient environment. While not discussed here in detail, it is contemplated that the lower dome may be similarly supported within the side walls of the process chamber using an O-ring (labeled with 182 in FIG. 1A). Fewer or more numbers of O-rings 182, 184 may be used.

The peripheral flange 204 may be made opaque or formed from clear quartz. The central window portion 202 of the upper dome 200 may be formed from a material such as clear quartz that is generally optically transparent to the direct radiations from the lamps without significant absorption. Alternatively, the central window portion 202 may be formed from a material having narrow band filtering capability. However, some of the heat radiation re-radiated from the heated substrate and the substrate support may pass into the central window portion 202 with significant absorption by the central window portion 202. These re-radiations generate heat within the central window portion 202, producing thermal expansion forces. The peripheral flange 204, which may be made opaque to protect the O-rings from being directly exposed to the heat radiation, remains relatively cooler than the central window portion 202, thereby causing the central window portion 202 to bow outward beyond the initial room temperature bow. The central window portion 202 is made thin and has sufficient flexibility to accommodate the bowing, while the peripheral flange 204 is thick and has sufficient rigidness to confine the central window portion 202. As a result, the thermal expansion within the central window portion 202 is expressed as thermal compensation bowing. The thermal compensation bowing of the central window portion 202 increases as the temperature of the process chamber increases.

The peripheral flange 204 and the central window portion 202 are secured at their opposite ends by a welded joint "B". The peripheral flange 204 is constructed with a fillet radius "r" along dimensional transition portion 213 that is defined by the smooth and gradual change from the thinness of the central window portion 202 to the bulk of the peripheral flange 204. FIG. 2C shows an enlarged view of the bonded joint "B" illustrating the fillet radius of the peripheral flange 204. The fillet radius is a continuously curved concave which may be considered as three curves including the bottom of the inside of the peripheral flange 204, the main body of the transition portion 213, and the portion that mates with the central window portion 202. Therefore, it may not be the same radius throughout three curves. The fillet radius is typically measured by determining the surface contour of the fillet radius and then mathematically determining the best fit sphere to this contour. The radius of this best fit sphere is the fillet radius.

The fillet radius eliminates sharp corners at the interface of the joint where the peripheral flange 204 and the central window portion 202 meet. The elimination of sharp corners also enables coatings to be deposited on the joints of the apparatus which are more uniform and thicker than joints having sharp corners. The fillet radius is selected to provide an increased radial thickness of the peripheral flange 204 for better flow along with the gradual variation and the "near-flat" curvature of the central window portion 202 (will be discussed below), resulting in reduced flow turbulence and better uniformity. Most importantly, the joints with fillet radius also reduce or eliminate shearing forces at the joints. In various embodiments, the fillet radius "r" of the peripheral flange ranges between about 0.1 inches and about 5 inches, such as between about 0.5 inches and about 2 inches. In one example, the fillet radius "r" is about 1 inch.

The peripheral flange 204 with a larger fillet radius is ideal handling thermal and atmospheric stresses. As discussed previously, during the processing of the substrate, the upper dome 200 is loaded with a high tensile stress due to large pressure differential between the reduced internal pressure within the process chamber and exterior atmospheric pressure acting on the upper dome. The high tensile stress can cause the upper dome to deform. However, it has been observed that the tensile stress of the upper dome 200 can be greatly reduced during the process if a lateral pressure "P" is inwardly applied to the side of the peripheral flange 204 (FIG. 2A). The lateral pressure applied onto the peripheral flange 204 forces the central window portion 202 to bow outward and thus compensate the dome deformation. The lateral pressure "P" herein refers to a given amount of loading force in pounds per square inch (psi) applied onto an outer peripheral surface 205 of the peripheral flange 204. In one embodiment, the lateral pressure "P" may be about 200 psi or above. In another embodiment, the lateral pressure "P" may be between about 45 psi and about 150 psi. In one example, the lateral pressure "P" is about 80 psi to about 120 psi.

It has been also observed that the tensile stress of the peripheral flange 204 can be decreased from 1300 psi to 2000 psi without lateral pressure "P", to below 1000 psi when a lateral pressure is applied to the peripheral flange 204. Incorporating with the larger fillet radius "r" mentioned previously, the tensile stress of the peripheral flange 204 can be greatly decreased when a lateral pressure "P" of about 80 psi is applied onto the peripheral flange 204. If the lateral pressure "P" is increased to about 150 psi, the tensile stress can be further reduced.

The thickness and outward curve of the central window portion 202 is selected to ensure that thermal compensation bowing is addressed. In the embodiment of FIG. 2A, the inner curve of the central window portion 202 is shown as spherical, formed by a section of a sphere having a center "C" along the axis "A" and a large radius of curvature "R". The central window portion 202 may have a radius of curvature "R" of about 1122 mm plus or minus 300 mm to provide sufficient bow to withstand pressure differentials between zero and one atmosphere at substrate temperatures between room temperature and processing temperatures of about 1200° C. or above. It is contemplated that the range of radius of curvature is intended to be for exemplary purpose only since it may vary depending upon the upper dome angle (θ), diameter and thickness, peripheral flange thickness or width and the pressure differential acting on the surfaces 210, 212 of the upper dome 200, etc. In various examples, the radius of curvature "R" may be about 900 mm to about 2500 mm.

Referring to FIG. 2A, in one embodiment the upper dome 200 is constructed in a manner that the central window portion 202 is sloping with respect to a horizontal plane "E" by an angle (θ). The horizontal plane "E" is generally parallel to a longitudinal direction of a substrate (not shown, such as substrate 108 of FIG. 1A). In various embodiments, the angle (θ) between the central window portion 202 and the horizontal plane "E" is generally less than 22°. In one embodiment, the angle (θ) is about 6° to about 21°, such as about 8° to about 16°. In one example, the angle (θ) is about 10°. The central window portion 202 sloped at about 10° provides an upper dome that is flatter than a conventional upper dome which typically has an angle (θ) of about 22° or greater. The reduction of degree of angle (θ) will result in the upper dome 200 moving down about 0.05 inch to about 0.8 inch, for example about 0.3 inch, as compared to the conventional upper dome.

The upper dome 200 may have a total outer diameter of about 200 mm to about 500 mm, such as about 240 mm to about 330 mm, for example about 295 mm. The central window portion 202 may have a thickness "$T_1$" of about 2 mm to about 10 mm, for example about 3 mm to about 6 mm. In one example, the central window portion 202 is about 4 mm in thickness. The central window portion 202 may have an outer diameter "$D_1$" of about 130 mm to about 250 mm, for example about 160 mm to about 210 mm. In one example, the central window portion 202 is about 190 mm in diameter. The peripheral flange 204 may have a thickness "$T_2$" of about 25 mm to about 125 mm, for example about 45 mm to about 90 mm. In one example, the peripheral flange 204 is about 70 mm in thickness. The peripheral flange 204 may have a width "$W_1$" of about 5 mm to about 90 mm, for example about 12 mm to about 60 mm, which may vary with radius. In one example, the peripheral flange 204 is about 30 mm in width. If the liner assembly is not used in the process chamber, the width of the peripheral flange 204 may be increased by about 50 mm to about 60 mm and the width of the central window portion 202 is decreased by the same amount. In such a case, the thickness of the peripheral flange 204 and the dome angle (θ) may be reduced accordingly and the amount of which can be calculated by those skilled in the art based on the present specification.

Figure 1C:
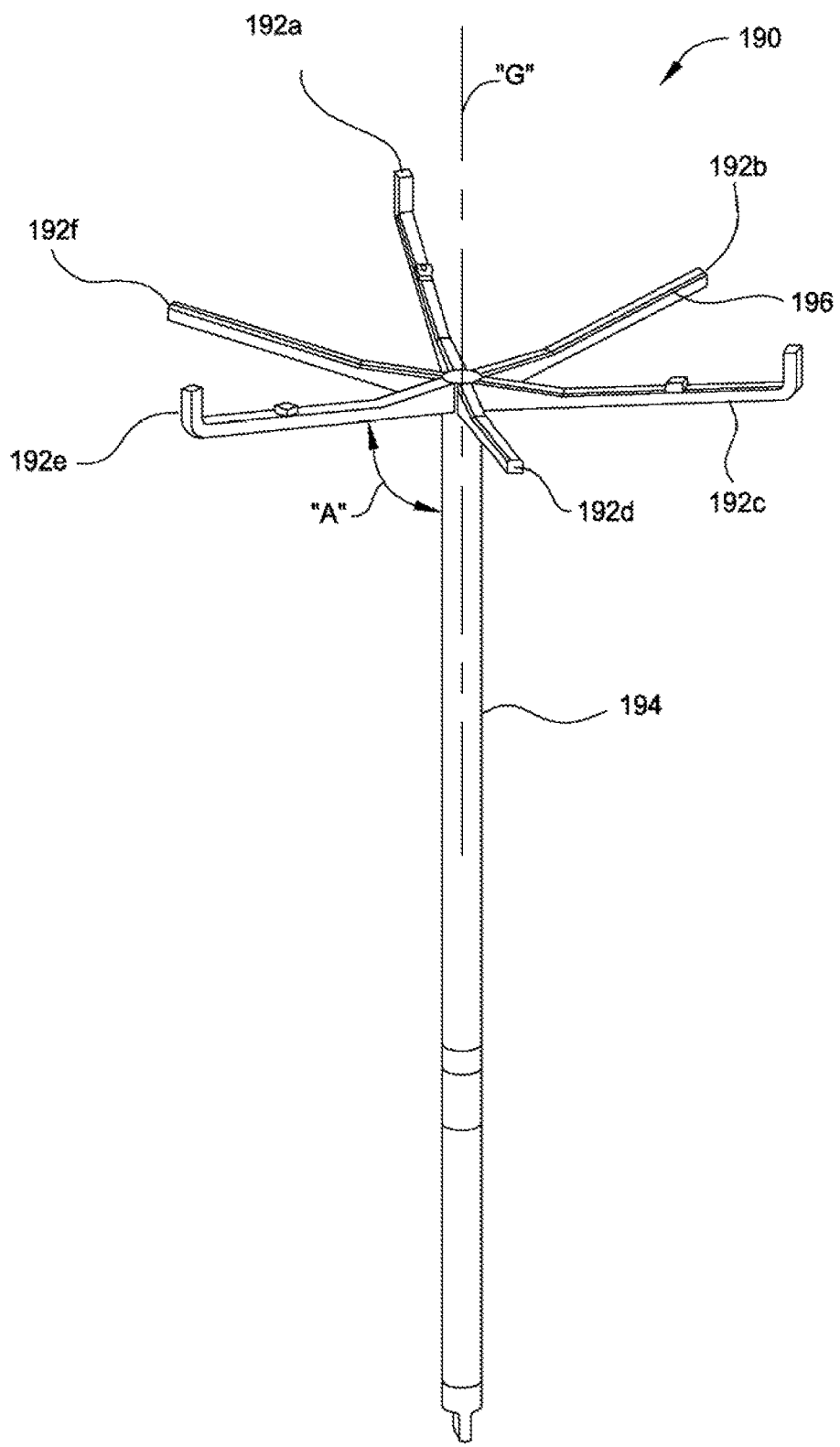
FIG. 1C illustrates a perspective view of a substrate support having three support arms and three dummy arms design.

If lower dome angles are adapted, the peripheral flange 204 may come in more towards the central window portion 202. However, the limiting factor on the central window portion 202 diameter is that the reflector (e.g., reflector 122 of FIG. 1) has to be able to reflect light back to the area of the substrate plus the pre-heat ring (if used). Therefore, it would be advantageous to move the peripheral flange 204 inboard slightly while being able to provide a central window portion 202 having a diameter of about 130 mm to about 300 mm.

The "near-flat" configuration of the upper dome 200, when combined with a base ring (such as the base ring 836 of FIG. 8A) and a flatter lower dome (such as the lower dome 700 of FIGS. 7A and 7B), forms a shallow, spherical geometry which has been proved to be effective at withstanding pressure differentials between the inner and the exterior of the process chamber—especially when a reduced pressure or low pressure application, such as an epitaxial deposition process, is performed. In addition, it has been observed that the "near-flat" configuration of the upper dome 200, with the lateral pressure applied onto the peripheral flange 204, leads to lower shear stress in the region of welded joint "B" located between the peripheral flange 204 and the central window portion 202. While stressing of the central window portion 202 due to pressure differential can be addressed by using a thicker window portion, thick window portion can provide too much thermal mass, which leads to time lags for steady-state processing. Therefore, the overall throughput is reduced. Also, the upper dome with thick window portion exhibits poor elasticity during processing and causes high shear stress at the peripheral flange 204 while the central window portion 202 is being radially contained by the peripheral flange 204. Furthermore, thick window portions take longer to dissipate heat which would affect the stabilization of the substrate. Since the spherical geometry inherently handles reduced pressure effectively, the upper dome 200 can employ quartz walls thinner than would be used by a conventional vessel with sudden large changes in cross sectional area above the substrate.

The thickness of the central window portion 202 of the upper dome 200 is selected at a range as discussed above to ensure that shear stresses developed at the interface between the peripheral flange 204 and the central window portion 202 (FIG. 2C) is addressed. The thinner quartz wall (i.e., the central window portion 202) is a more efficient heat transfer medium so that less energy is absorbed by the quartz. The upper dome therefore remains relatively cooler. The thinner wall domes will also stabilize in temperature faster and respond to convective cooling quicker since less energy is being stored and the conductive path to the outside surface is shorter. Therefore, the temperature of the upper dome 200 can be more closely held at a desired set point to provide better thermal uniformity across the central window portion 202. In addition, while the central window portion 202 conducts radially to the peripheral flange 204, a thinner dome wall results in improved temperature uniformity over the substrate. It may be advantageous to not excessively heat the peripheral flange 204 to protect the O-rings disposed around the peripheral flange 204. It is also advantageous to not excessively cool the central window portion 202 in the radial direction as this would result in unwanted temperature gradients which will reflect onto the surface of the substrate being processed and cause film uniformity to suffer.

Table 1 below provides non-limiting particulars of the upper dome 200 which is given as an illustrative example according to embodiments of the present invention.

TABLE 1

| Degree angle (θ) (degree) | 8-16 |
| Central window portion thickness (mm) | 2-10 |
| Fillet radius (inches) | 0.5-2 |
| Outer diameter of central window portion (mm) | 130-250 |
| Total outer diameter (mm) | 240-360 |
| Peripheral flange width (mm) | 10-70 |
| Peripheral flange thickness (mm) | 25-125 |
| Lateral pressure on peripheral flange (psi) | 0-150 |
| Exterior pressure on upper dome (Torr) | 760 |
| Chamber pressure (Torr) | 0.1 |

By flattening out the upper dome 200, the radiation heat transfer characteristics of the process chamber are vastly improved with lower parasitic losses, less noise to the temperature sensors since the pyrometers can be positioned as close as possible to the substrate surface. The improved upper dome and the lower dome (as will be discussed below with respect to FIGS. 7A-7C) also results in a reduced overall chamber volume, which improves gas transition times and lowers the pumping and venting times, resulting in lower cycle times and improved substrate throughput. In addition, the "near-flat" configuration of the upper dome avoids or significantly minimizes gas flow turbulence or circulation in the upper processing region of the chamber as it avoids the problem associated with the prior design having sudden change in cross sectional area above the substrate that negatively influences flow uniformity. Being near flat with increased flange radius also facilitates the constant exhaust gas pressure uniformity across the chamber cross section, resulting in highly uniform flow fields over the substrate.

Exemplary Lower Dome

FIGS. 7A and 7B are schematic illustrations of a lower dome 700 that may be used in place of the lower dome 114 of FIG. 1A according to one embodiment of the invention. FIG. 7A illustrates a cross-sectional view of the lower dome 700. FIG. 7B illustrates a top view of the lower dome 700. As can be seen in FIG. 7A, the lower dome 700 is formed in the shape of a generally circular, shallow martini glass or funnel with a central opening 708. The lower dome 700 is radially symmetrical about a center axis "C" (FIG. 7B). The central opening 708, as discussed previously, provides free movement of a shaft (such as the central shaft 132 of FIG. 1) therethrough during loading and unloading of a substrate. The lower dome 700 generally includes a stem portion 702, a peripheral flange 704, and a bottom 706 radially extended to connect the stem portion 702 and the peripheral flange 704. The peripheral flange 704 is configured to surround a circumference of the bottom 706. Alternatively, the peripheral flange 704 may at least partially surround the bottom 706, depending upon the chamber design. The peripheral flange 704 and the bottom 706, when combined with an upper dome and a base ring (such as the upper dome 128 and base ring 136 of FIG. 1), generally define an internal volume of the process chamber.

As will be discussed below, the bottom 706 is made thin and has sufficient flexibility to accommodate the bowing during the process, while the peripheral flange 704 is thick and has sufficient rigidity to confine the bottom 706. The peripheral flange 704 may be made opaque to protect the O-rings (labeled with 182 in FIG. 1) from being directly exposed to the heat radiation. Alternatively, the peripheral flange 704 may be formed from clear quartz. The bottom 706 of the lower dome 700 may be formed from a material that is generally optically transparent to the direct radiations from the lamps without significant absorption.

The peripheral flange 704 and the bottom 706 are secured at their opposite ends by a welded joint "B". The peripheral flange 704 is constructed with a fillet radius "r" along dimensional transition portion 713 that is defined by the smooth and gradual change from the thinness of the bottom 206 to the bulk of the peripheral flange 704. FIG. 7C shows an enlarged view of the bonded joint "B" illustrating the fillet radius of the peripheral flange 704. The fillet radius is a continuously curved concave which may be considered as three curves including the top of the peripheral flange 704, the main body of the transition portion 713, and the portion that mates with the bottom 706. Therefore, it may not be the same radius throughout three curves. The fillet radius is typically measured by determining the surface contour of the fillet radius and then mathematically determining the best fit sphere to this contour. The radius of this best fit sphere is the fillet radius.

The fillet radius eliminates sharp corners at the interface of the joint where the peripheral flange 704 and the bottom 706 meet. The elimination of sharp corners also enables coatings to be deposited on the joints of the apparatus which are more uniform and thicker than joints having sharp corners. The fillet radius is selected to provide an increased radial thickness of the peripheral flange 704 along with the gradual variation and the "near-flat" configuration of the bottom 706 (will be discussed below), providing a uniform radiation heat transfer to the substrate since the lamps can be placed closer to the substrate. Most importantly, the joints with fillet radius also reduce or eliminate shearing forces at the joints. In various embodiments, the fillet radius "r" of the peripheral flange 704 may range between about 0.1 inches and about 5 inches, such as between about 0.5 inches and about 2 inches. In one example, the fillet radius "r" is about 1 inch.

The peripheral flange 704 with a larger fillet radius is ideal handling thermal and atmospheric stresses. During the processing of the substrate, the lower dome 700 is loaded with a high tensile stress due to large pressure differential between the reduced internal pressure within the process chamber and exterior atmospheric pressure acting on the lower dome. The high tensile stress can cause the lower dome to deform. However, it has been observed that the tensile stress of the lower dome can be greatly reduced during the process if a lateral pressure "P" is inwardly applied to the side of the peripheral flange 704 (see FIG. 7A). The lateral pressure applied onto the peripheral flange 704 forces the bottom 706 to bow outward and thus compensate the dome deformation. The lateral pressure "P" herein refers to a given amount of loading force in pounds per square inch (psi) applied onto an outer peripheral surface 726 of the peripheral flange 704. In one embodiment, the lateral pressure "P" may be about 280 psi or above. In another embodiment, the lateral pressure "P" may be between about 60 psi and about 250 psi. In one example, the lateral pressure "P" is about 80 psi.

It has been observed that the tensile stress of the peripheral flange 704 can be decreased from 1300 psi to 2000 psi without lateral pressure "P", to below 1000 psi when a lateral pressure is applied to the peripheral flange 704. Incorporating with the larger fillet radius "r" mentioned previously, the tensile stress of the peripheral flange 704 can be greatly decreased when a lateral pressure "P" of about 80 psi is applied onto the peripheral flange 704.

Referring to FIG. 7A, in one embodiment the lower dome 700 is constructed in a manner that the bottom 706 is sloping with respect to a horizontal plane "A" by an angle ($\theta$). The horizontal plane "A" is generally parallel to a longitudinal direction of a substrate (not shown, such as substrate 108 of FIG. 1A). In various embodiments, the angle ($\theta$) between the bottom 706 and the horizontal plane "A" is generally less than 22°. In one embodiment, the angle ($\theta$) is about 6° to about 21°, such as about 8° to about 16°. In another embodiment, the angle ($\theta$) is about 6° to about 12°. In one example, the angle ($\theta$) is about 10°. The bottom 706 sloped at about 10° provides a lower dome 700 that is flatter than a conventional lower dome which typically has an angle ($\theta$) of about 22° or greater. The reduction of degree of angle ($\theta$) will result in the lower dome 700 moving up about 0.3 inch to about 1 inch, for example about 0.6 inch, as compared to the conventional lower dome.

The thickness of the bottom 706 of the lower dome 700 is selected to ensure that shear stresses developed at the interface between the peripheral flange 704 and the bottom 706 (FIG. 2C) is addressed. In various embodiments of the invention, the bottom 706 may have a thickness "$T_2$" within a range from about 2 mm to about 16 mm, such as between about 3.5 mm and about 10 mm. In one example, the bottom 706 may have a thickness of about 6 mm. The bottom 706 may have an outer diameter "$D_2$" of about 300 mm to about 600 mm, for example about 440 mm. The peripheral flange 704 may have a thickness "$T_2$" within a range from about 20 mm to about 50 mm, for example about 30 mm, and a width "$W_2$" of about 10 mm to about 90 mm, for example about 50 mm to about 75 mm, which may vary with radius. In one example, the lower dome 700 may have a total outer diameter of about 500 mm to about 800 mm, for example about 600 mm. The central opening 708 may have an outer diameter of about 300 mm to about 500 mm, for example about 400 mm. In another embodiment, the central opening 708 may have an outer diameter of about 10 mm to about 100 mm, for example about 20 mm to about 50 mm, such as about 35 mm. It is contemplated that the size, angle ($\theta$) and the thickness of the lower dome may vary, depending upon the chamber design and the pressure differential acting on the sides of the lower dome 700.

The "near-flat" configuration of the lower dome 700, when combined with a base ring (such as the base ring 836 of FIG. 8A) and a flatter upper dome (such as the upper dome 200 of FIG. 2A-2B), forms a shallow, spherical geometry which has been proved to be effective at withstanding pressure differentials between the inner and the exterior of the process chamber—especially when a reduced pressure or low pressure application, such as an epitaxial deposition process, is performed. In addition, it has been observed that the "near-flat" configuration of the lower dome 700, with the lateral pressure applied onto the peripheral flange 704, leads to lower shear stress in the region of welded joint "B" located between the peripheral flange 704 and the bottom 706. While stressing of the bottom 706 due to pressure differential can be addressed by using a thicker dome wall (i.e., the bottom 706), thick dome wall can cause too much thermal mass, which leads to time lags for steady-state processing. Therefore, the overall throughput is reduced. Also, thick dome wall exhibits poor elasticity during processing and causes high shear stress at the peripheral flange 704 while the bottom 706 is being radially contained by the peripheral flange 704. Thick dome wall also takes longer to dissipate heat which would affect the stabilization of the substrate. Since the spherical geometry inherently handles reduced pressure effectively, the lower dome 700 can employ a dome wall that is thinner than those conventional vessels having sudden large changes in cross sectional area under the substrate.

Table 2 below provides non-limiting particulars of the lower dome 700 which are given as an illustrative example according to embodiments of the present invention.

TABLE 2

| | |
|---|---|
| Degree angle ($\theta$) (degree) | 6-16 |
| Bottom thickness (mm) | 3.5-10 |
| Fillet radius (inches) | 0.5-2 |
| Outer diameter of bottom (mm) | 300-600 |
| Total outer diameter (mm) | 500-800 |
| Peripheral flange width (mm) | 50-75 |
| Peripheral flange thickness (mm) | 25-50 |
| Lateral pressure on peripheral flange (psi) | 0-150 |
| Exterior pressure on lower dome (Torr) | 760 |
| Chamber pressure (Torr) | 0.1 |

By flattening out the lower dome 700 and the upper dome 200 as discussed above, the processing volume of the process chamber is decreased, which in turn reduces pumping and venting times. Therefore, the substrate throughput is improved. The improved lower dome also provides a constant, uniform radiation heat transfer to the susceptor and the substrate because the radiant heating lamps can be placed as close to the backside of the substrate as possible, resulting in better transmission, cleaner zonal uniformity on the backside of the susceptor (if a plate-like substrate support (FIG. 1A) were used), or the backside of the substrate (if a ring-like substrate support (FIG. 1B) were used), thereby lowering parasitic losses since the radiant heating lamps can be configured as parallel as possible to the susceptor on which the substrate is placed. If desired, high resistance contact may be introduced between quartz domes along flow path to mitigate cross-talk.

Exemplary Base Ring

Figure 8A:
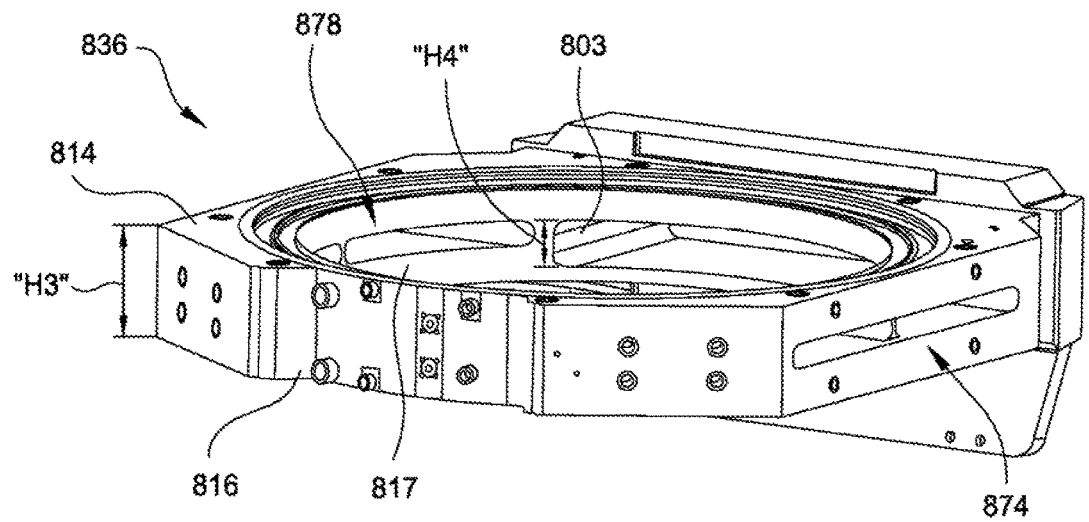
FIG. 8A shows a perspective cross-sectional view of an exemplary base ring that may be used in replace of the base ring of FIGS. 1A and 1B.

FIG. 8A shows a perspective cross-sectional view of an exemplary base ring that may be used in place of the base ring 136 as shown in FIGS. 1A and 1B. The base ring 836 may be formed of aluminum or any suitable material such as stainless steel. The base ring 836 generally includes a loading port 803, a process gas inlet 874, and a gas outlet 878, and function in a similar way to the loading port 103, the process gas inlet 174 and the gas outlet 178 shown in FIGS. 1A and 1B. The base ring 836 comprises a ring body sized to be received within an inner circumference of the processing chamber of FIG. 1. The ring body may have a generally oblong shape with the long side on the loading port 803 and the short sides on the process gas inlet 874 and the gas outlet 878, respectively. The loading port 803, the process gas inlet 874 and the gas outlet 878 may be angularly offset at about 90° with respect to each other. In one example, the loading port 803 is located on a side of the base ring 836 between the process gas inlet 874 and the gas outlet 878, with the process gas inlet 874 and the gas outlet 878 disposed at opposing ends of the base ring 836. In various embodiments, the loading port 803, the process gas inlet 874 and the gas outlet 878 are aligned to each other and disposed at substantially the same level as the loading port 103, the process gas inlet 174 and the gas outlet 178 of FIGS. 1A-1B.

The inner circumference 817 of the base ring 836 is configured to receive a liner assembly, for example the liner assembly 163 of FIG. 1A or the liner assembly 600 as discussed above with respect to FIG. 6. The loading port 803, the process gas inlet 874, and the gas outlet 878 of the base ring 836 are configurable to work in conjunction with the liner assembly (FIG. 6) and the gas inlet mechanism (FIGS. 3A-3C), to provide one or more process/purge gases into the processing volume.

While not shown, fasteners may be disposed through fastening receptacles (not shown) formed on the top surface 814 of the base ring 836 and into recesses (not shown) in a clamp ring (e.g., the clamp ring 130 of FIG. 1A or clamp ring 400 of FIG. 4A) to secure the peripheral flange of upper dome 128 between the base ring 836 and the clamp ring.

In one embodiment, the loading port 803 may have a height "H4" of about 0.5 inches to about 2 inches, for example about 1.5 inches. The base ring 136 may have a height "H3" of about 2 inches to about 6 inches, for example about 4 inches. The height of the base ring 836 is designed such that the overall height of the base ring 836 is about 0.5 inch to about 1 inch shorter than that of the conventional base ring height. Therefore, the distance between the substrate and an optical pyrometer (not shown, such as the optical pyrometer 118 of FIG. 1A) is also reduced. As a result, the reading resolution of the optical pyrometer can be greatly improved. In one example, the distance between the substrate and the optical pyrometer is about 250 mm. By reducing the distance between the substrate and pyrometer as well as upper and lower domes, the radiation heat transfer characteristics of the process chamber are vastly improved with lower parasitic losses, less noise to the temperature sensors, and more heat transfer with improved center-to-edge uniformity from the radiant heating lamps to the substrate as well as the upper reflector to the substrate. The reduced height of the base ring 836 and the "near-flat" configuration of the upper dome as discussed above with respect to FIGS. 2A-2B also enable a robust and accurate pyrometry at lower temperatures below 500° C. The configuration of the process gas inlet 874 and gas outlet 878 enables a concentric process kit (e.g., liner assembly) which greatly enhances in the liner's ability to contain light leakage, allowing pyrometery to be more accurate at temperatures below 500° C.

Figure 8B:
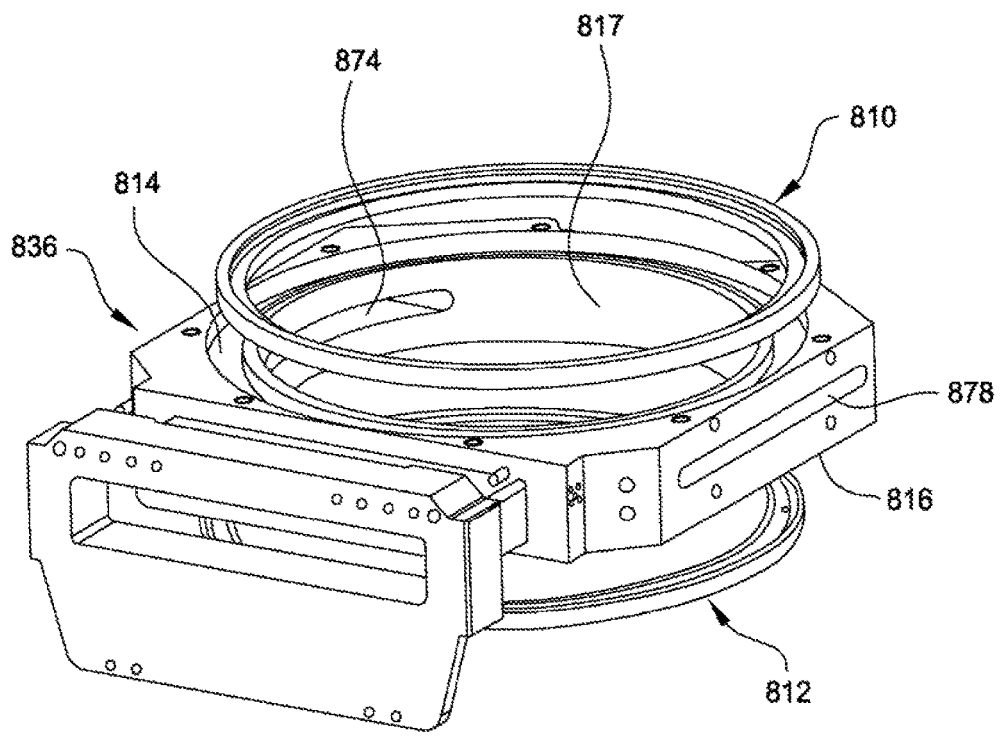
FIG. 8B is a perspective view of the base ring of FIG. 8A from another angle showing an upper ring and a lower ring according to one embodiment of the invention.

Since the base ring 836 is formed of a heat conductive material and is closer to the radiant heating lamps due to the near-flat configuration of the lower dome, the base ring 836 may include one or more coolant channels formed therein through which a cooling fluid, such as water, is flowed for cooling of the base ring. The coolant channels may be disposed around the circumference of the base ring 836 in a region proximity to an O-ring (e.g., O-rings 182, 184 of FIG. 1A). FIG. 8B is a perspective view of the base ring 836 of FIG. 8A from another angle showing an upper ring 810 and a lower ring 812 according to one embodiment of the invention. The upper ring 810 and the lower ring 812 are configured to dispose on the top surface 814 and the bottom surface 816 of the base ring 836, respectively. The upper ring 810 and the lower ring 812 have an annular shape and are generally concentric or coaxial once they are assembled with the base ring 836.

Figure 8C:
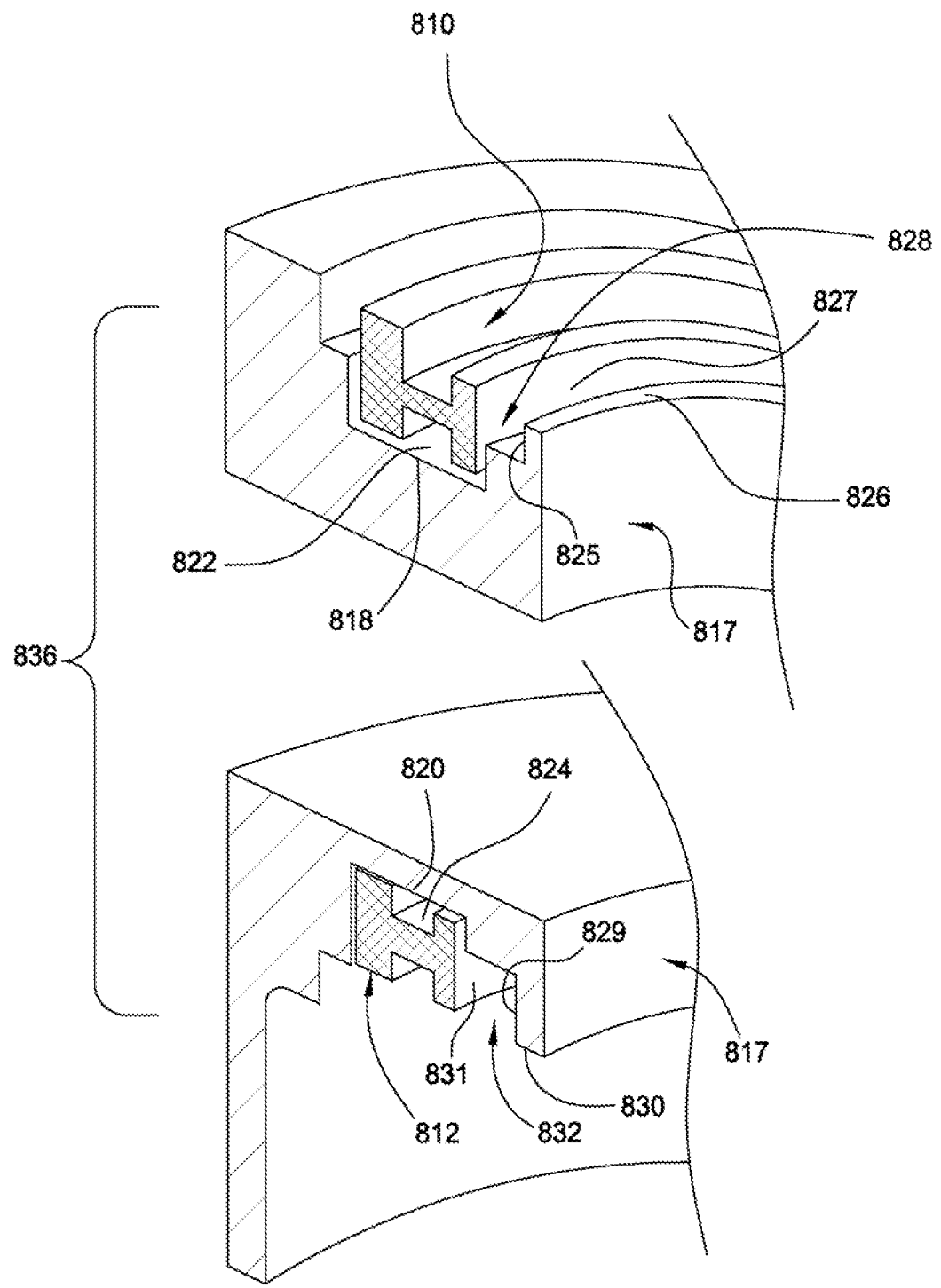
FIG. 8C is an enlarged, partial cross-sectional view of the base ring of FIG. 8B showing an upper trench and a lower trench formed in the top surface and the bottom surface of the base ring, respectively, for receiving the upper ring and the lower ring.

FIG. 8C is an enlarged, partial cross-sectional view of the base ring 836 of FIG. 8B showing an upper trench 818 and a lower trench 820 formed in the top surface 814 and the bottom surface 816 (FIG. 8B) of the base ring 836, respectively, for receiving the upper ring 810 and the lower ring 812. The base ring 836 is schematically shown as two separate parts for ease of understanding. The upper and lower trenches 818, 820 may be formed adjacent to an inner circumference 817 of the base ring 836. The upper ring 810 may be formed in generally an "H" shape so that when it is rested within the upper trench 818, an annular fluid flow path is defined between the upper ring 810 and the upper trench 818 and forms an upper coolant channel 822 for the base ring 836. Similarly, the lower ring 812 may be formed in generally an "H" shape so that when it is rested within the lower trench 820, an annular fluid flow path is defined between the lower ring 812 and the lower trench 820 and forms a lower coolant channel 824 for the base ring 836. The upper ring 810, the lower ring 812, and the base ring 836 may be welded together forming an integrated body. The top and lower rings 810, 812 may be formed in any desired shape as long as the cooling fluid is circulated through respective annular fluid flow path defined between the top and lower rings 810, 812 and the base ring 836 for proper cooling of the base ring 836.

In one embodiment, the base ring 836 may include a top interior wall 826 extending upwardly from the top surface 814 of the base ring 836. The top interior wall 826 is configured around the inner circumference 817 of the base ring 836 so that an outer portion 825 of the top interior wall 826 and an inner portion 827 of the upper ring 810 defines a top annular trench 828, proximity to the upper trench 818, for placement of an O-ring (not shown, e.g., O-rings 182, 184 of FIG. 1A). Similarly, the base ring 836 may also include a bottom interior wall 830 extending downwardly from the bottom surface 816 of the base ring 836. The bottom interior wall 830 is configured around the inner circumference 817 of the base ring 836 so that an outer portion 829 of the bottom interior wall 830 and an inner portion 831 of the lower ring 812 defines a bottom annular trench 832, proximity to the lower trench 820, for placement of an O-ring (not shown, e.g., O-rings 182, 184 of FIG. 1A).

During process, cooling fluid is introduced from a cooling source (not shown) to the upper and lower coolant channels 822, 824 disposed around the inner circumference 817 of the base ring 836 because the inner circumference 817 of the base ring 836 is exposed to the most heat, being nearest to the process conditions of the process chamber 100. The cooling fluid absorbs heat from the inner circumference 817 of the base ring 836 most efficiently because the cooling fluid is constantly introduced. The cooling fluid is flowed in a countercurrent fashion through the upper and lower coolant channels 822, 824 to help maintain the base ring 836 and the O-rings at a relatively low temperature.

While the foregoing is directed to embodiments of the present invention, other and further embodiments of the invention may be devised without departing from the basic scope thereof, and the scope thereof is determined by the claims that follow.

The invention claimed is:

1. A base ring assembly for a substrate processing chamber, comprising:

a ring body to be disposed within an inner circumference of the substrate processing chamber, the ring body having:
  a substrate loading port;
  a gas inlet;
  a gas outlet, wherein the gas inlet and the gas outlet are disposed at opposing ends of the ring body;
  an upper trench formed in a top surface of the ring body; and
  a lower trench formed in a bottom surface of the ring body;
a first ring removably disposed within the upper trench of the ring body, the first ring and the upper trench define a first annular channel therebetween;
a first wall extending upwardly from the top surface of the ring body, wherein the first wall is disposed around an inner circumference of the ring body, and an outer portion of the first wall and an inner portion of the first ring define a first annular trench;
a second ring removably disposed within the lower trench of the ring body, the second ring and the lower trench define a second annular channel therebetween; and
a second wall extending downwardly from the bottom surface of the ring body, wherein the second wall is disposed around an inner circumference of the ring body, and an outer portion of the second wall and an inner portion of the second ring defines a second annular trench,
wherein each of the first annular trench and the second annular trench is to receive an O-ring to be disposed within the first annular trench and the second annular trench, and the first annular channel and the second annular channel are in fluid communication with a fluid source.

2. The base ring assembly of claim 1, wherein the ring body is formed of aluminum or stainless steel.

3. The base ring assembly of claim 1, wherein the substrate loading port, the gas inlet, and the gas outlet are intersected by a plane.

4. The base ring assembly of claim 1, wherein the substrate loading port is angularly offset at about 90° with respect to the gas inlet and the gas outlet within a plane where the substrate loading port, the gas inlet, and the gas outlet are disposed.

5. The base ring assembly of claim 1, wherein the substrate loading port has a height of about 0.5 inches to about 2 inches.

6. The base ring assembly of claim 1, wherein the ring body has a height of about 2 inches to about 6 inches.

7. The base ring assembly of claim 1, wherein the first ring, the second ring, and the ring body are formed as an integrated body.

8. The base ring assembly of claim 1, wherein the first ring and the second ring have a general "H" shaped cross-section.

9. A process chamber for processing a substrate, comprising:
  a substrate support disposed within the process chamber, the substrate support having a substrate support surface;
  a lower dome disposed relatively below the substrate support;
  an upper dome disposed relatively above the substrate support, the upper dome being opposed to the lower dome; and
  a ring body to be disposed within an inner circumference of the process chamber, the ring body comprising:
    a substrate loading port;
    a gas inlet;
    a gas outlet, wherein the gas inlet and the gas outlet are disposed at opposing ends of the ring body;
    an upper trench formed in a top surface of the ring body; and
    a lower trench formed in a bottom surface of the ring body;
    a first ring removably disposed within the upper trench of the ring body, the first ring and the upper trench define a first annular channel therebetween;
    a first wall extending upwardly from the top surface of the ring body, the first wall is disposed around an inner circumference of the ring body, and an outer portion of the first wall and an inner portion of the first ring define a first annular trench;
    a second ring removably disposed within the lower trench of the ring body, the second ring and the lower trench define a second annular channel therebetween; and
    a second wall extending downwardly from the bottom surface of the ring body, the second wall is disposed around an inner circumference of the ring body, and an outer portion of the second wall and an inner portion of the second ring define a second annular trench,
    wherein each of the first annular trench and the second annular trench is to receive an O-ring to be disposed within the first annular trench and the second annular trench, and the first annular channel and the second annular channel are in fluid communication with a fluid source.

10. The process chamber of claim 9, wherein the ring body is formed of aluminum or stainless steel.

11. The process chamber of claim 9, wherein the first ring, the second ring, and the ring body are formed as an integrated body.

12. The process chamber of claim 9, wherein the first ring and the second ring have a general "H" shaped cross-section.

13. The process chamber of claim 9, wherein the upper dome comprises:
  a central window portion; and
  a peripheral flange engaging the central window portion at a circumference of the central window portion, wherein a tangent line on an inside surface of the central window portion that passes through an intersection of the central window portion and the peripheral flange is at an angle of about 8° to about 16° with respect to a planar upper surface of the peripheral flange.

14. The process chamber of claim 9, wherein the lower dome comprises:
  a central opening;
  a peripheral flange; and
  a bottom extended radially outward to connect the peripheral flange and the central opening, wherein a tangent line on an outside surface of the bottom that passes through an intersection of the bottom and the peripheral flange of the lower dome is at an angle of about 8° to about 16° with respect to a planar bottom surface of the peripheral flange of the lower dome.

15. A base ring assembly for a substrate processing chamber, comprising:
  a ring body to be disposed within an inner circumference of the substrate processing chamber, the ring body having:
    a substrate loading port;
    a gas inlet;

a gas outlet, wherein the gas inlet and the gas outlet are disposed at opposing ends of the ring body;
an upper trench formed in a top surface of the ring body; and
a lower trench formed in a bottom surface of the ring body;
a first ring removably disposed within the upper trench of the ring body, wherein the first ring has a general "H" shaped cross-section, and the first ring and the upper trench define a first annular channel therebetween;
a first wall extending upwardly from the top surface of the ring body, wherein an outer portion of the first wall and an inner portion of the first ring define a first annular trench;
a second ring removably disposed within the lower trench of the ring body, wherein the second ring has a general "H" shaped cross-section, the second ring and the lower trench define a second annular channel therebetween; and
a second wall extending downwardly from the bottom surface of the ring body, wherein an outer portion of the second wall and an inner portion of the second ring defines a second annular trench.

* * * * *